United States Patent
Kimelman et al.

(10) Patent No.: US 7,412,633 B2
(45) Date of Patent: Aug. 12, 2008

(54) COMMUNICATION INTERFACE FOR DIAGNOSTIC CIRCUITS OF AN INTEGRATED CIRCUIT

(75) Inventors: Paul Kimelman, Alamo, CA (US); Edmond John Simon Ashfield, Cambridge (GB); Thomas Sean Houlihane, Bassingbourn (GB); Ian Field, Walnut Creek, CA (US)

(73) Assignee: ARM Limited, Cambridge (GB)

( * ) Notice: Subject to any disclaimer, the term of this patent is extended or adjusted under 35 U.S.C. 154(b) by 127 days.

(21) Appl. No.: 11/343,210

(22) Filed: Jan. 31, 2006

(65) Prior Publication Data

US 2006/0242501 A1    Oct. 26, 2006

Related U.S. Application Data

(63) Continuation-in-part of application No. 10/417,330, filed on Apr. 17, 2003, now Pat. No. 7,197,680.

(51) Int. Cl.
*G01R 31/28* (2006.01)
(52) U.S. Cl. .................................... 714/724

(58) Field of Classification Search ............... 714/724, 714/726
See application file for complete search history.

(56) References Cited

U.S. PATENT DOCUMENTS

| 5,734,660 | A | 3/1998 | Fujisaki |
| 5,842,007 | A | 11/1998 | Tarsky et al. |
| 6,041,406 | A | 3/2000 | Mann |
| 6,134,481 | A | 10/2000 | Warren |
| 6,968,472 | B2 * | 11/2005 | Fernald ................. 713/400 |

FOREIGN PATENT DOCUMENTS

| EP | 0 840 219 | 5/1998 |
| EP | 1 213 657 | 6/2002 |

* cited by examiner

*Primary Examiner*—James C Kerveros
(74) *Attorney, Agent, or Firm*—Nixon & Vanderhye P.C.

(57) ABSTRACT

An integrated circuit is provided with diagnostic circuitry, such as serial scan chains or debug bus access circuits, with which communication is established using an interface circuit coupled with a bi-directional serial link to an external diagnostic device. The bi-directional serial link carries both data and control signals.

42 Claims, 13 Drawing Sheets

Interface Training

COMMUNICATION INTERFACE FOR DIAGNOSTIC CIRCUITS OF AN INTEGRATED CIRCUIT

This application is a continuation-in-part (CIP) of U.S. application Ser. No. 10/417,330 filed 17 Apr. 2003, now U.S. Pat. No. 7,197,680, the entire content of which is hereby incorporated by reference.

BACKGROUND OF THE INVENTION

1. Field of the Invention

This invention relates to the field of integrated circuits. More particularly, this invention relates to integrated circuits having on-board diagnostic circuitry with which it is desired to communicate via a diagnostic interface.

2. Description of the Prior Art

It is known to provide integrated circuits with on-board diagnostic systems. Examples of such systems are BIST controllers for testing on-chip memories, boundary scan cell chains and more general scan cell chains. It is known to provide dedicated diagnostic circuit interfaces to integrated circuits, for example such interfaces as utilised by the TAP controllers of JTAG diagnostic systems built in accordance with the IEEE Standard 1149. The JTAG interface typically requires four to six external pins dedicated for this use on the integrated circuit package.

As integrated circuits increase in complexity, size and performance, there is a general requirement for an increase in the number of external pin connections that can be made to the integrated circuit to support its functional (non-diagnostic) operation. It is desirable that the on-board diagnostic systems of an integrated circuit should have a small impact upon the functional behaviour and performance of the integrated circuit.

SUMMARY OF THE INVENTION

Viewed from one aspect the present invention provides an integrated circuit for processing data, said integrated circuit comprising:

a functional circuit operable to perform data processing operations:

a diagnostic circuit operable to perform diagnostic operations upon said functional circuit and an interface circuit using a bi-directional serial signal to provide communications between said diagnostic circuit and an external diagnostic device.

The invention recognises that the multiple external pins dedicated to on-board diagnostic systems represent a disadvantageous overhead in the provision of such on-board diagnostic systems. The present technique utilises a bi-directional serial signal to transfer both control signals and diagnostic data as required between the on-board diagnostic systems and an external diagnostic device, such as a computer with an interface card. This allows an advantageous reduction in the number of pins required to support the diagnostic functionality and in some embodiments this can be reduced to a requirement for a single external pin.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
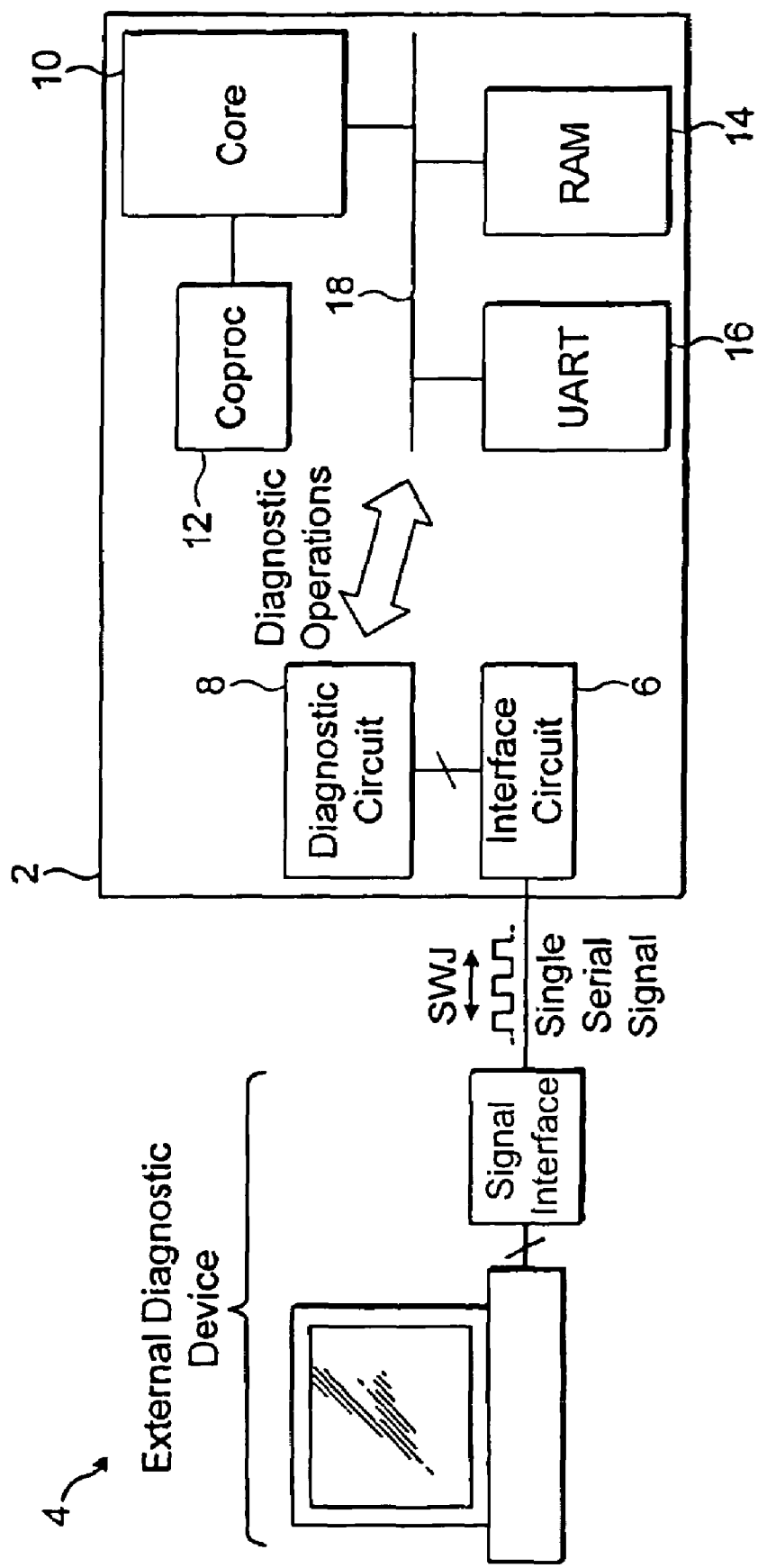
FIG. 1 schematically illustrates an integrated circuit including on-board diagnostic systems connected to an external diagnostic device.

FIG. 1 illustrates an integrated circuit 2 connected to an external diagnostic device 4. The connection between the external diagnostic device 4 and integrated circuit 2 is via a bi-directional serial interface, such as SWJ. Within the integrated circuit 2, an interface circuit 6 receives the bi-directional signal(s). The data decoded from that serial signal and control signals decoded from that serial signal are passed to a diagnostic circuit 8 which performs diagnostic operations on the other elements of the integrated circuit 2 in dependence upon those control signals and data. Data and control signals may also be passed back from the integrated circuit 2 to the external diagnostic device 4 via the bi-directional serial signal. The integrated circuit 2 will typically be a system-on-chip (SoC) integrated circuit.

The functional circuits within the integrated circuit 2 include a processor core 10, a coprocessor 12, a memory 14 and a serial UART device 16. These functional circuits are connected by a functional bus 18 (e.g. an AMBA, AHB or other bus for connecting functional circuits). The diagnostic circuit 8 is schematically illustrated as a block within the integrated circuit 2. It will be appreciated that this diagnostic circuit could take a variety of different forms and may, for example, include serial scan chains extending around the periphery of the integrated circuit 2, certain functional elements or within certain functional elements as required. The diagnostic circuitry 8 may also have other forms such as a BIST device and the like.

In use, an engineer using the external diagnostic device will command certain diagnostic operations to be performed on the integrated circuit 2 in response to control signals and data passed to the integrated circuit 2 along the bi-directional serial interface and via the interface circuit 6. Result data will be passed back through the interface circuit 6 along the bi-directional interface to the external diagnostic device 4.

Figure 2:
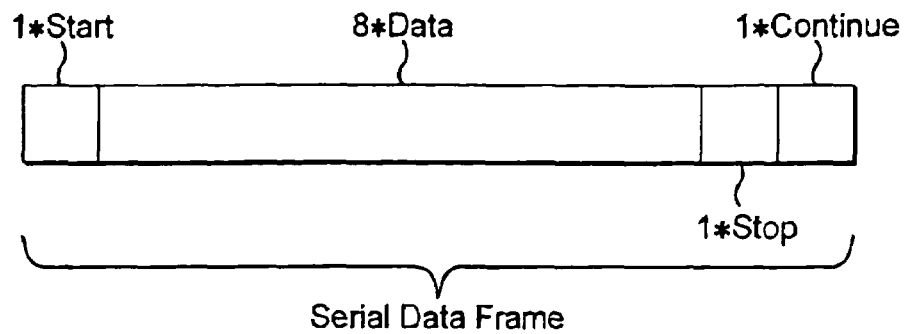
FIG. 2 illustrates a serial data frame for use in communicating between an external diagnostic device and an interface circuit of an integrated circuit.

FIG. 2 illustrates a frame of serial data. This comprises a start bit followed by eight data bits, a stop bit and a continue bit. The stop bit and the continue bit can be considered to be part of a stop signal terminating the serial frame. The use of this serial data frame protocol to pass 8-bit data values, which may be pure data values or contain embedded control instructions, to the diagnostic circuit 8 as well as the control functions provided by the start bit, stop bit and continue bit themselves will be described in the following. It will be appreciated that in different embodiments the number of bits in a frame could be different, including different numbers of data, start and/or stop bits.

Figure 3:
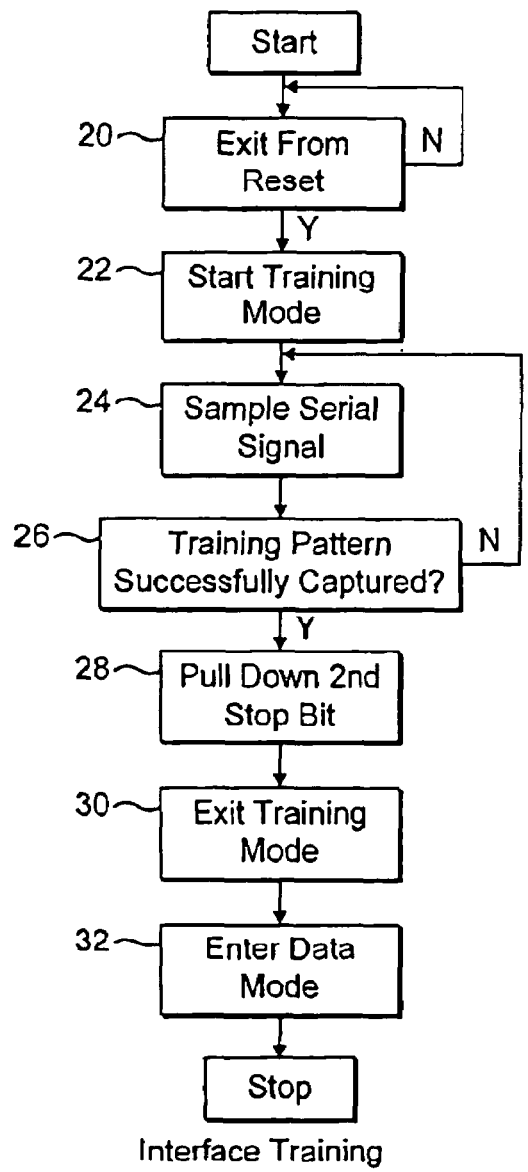
FIG. 3 is a flow diagram schematically illustrating the interface training operations of an interface circuit.

FIG. 3 is a flow diagram illustrating the training of the interface circuit 6. The interface circuit 6 is operable in a non-clocked mode to extract timing information from the serial data signal itself as to the sampling points to be used. This is achieved by training the interface circuit 6. The training takes the form of the external diagnostic device 4 sending a known serial data stream (e.g. alternating values of 0 and 1), with the interface circuit seeking to sample this training pattern in a way that the correct sequence is properly received. The interface circuit 6 initialises upon powerup or following a reset into the training mode during which it looks to receive the training pattern. When it receives this training pattern it issues a continue signal which the external diagnostic device 4 can interpret to mean that the training pattern has successfully been received and accordingly the interface circuit 6 is now using sampling points appropriate to the serial data stream. The external diagnostic device can alter (e.g. lower) the data rate of the serial data until the interface circuit 6 is able to correctly receive it and issue the appropriate indication that it is trained.

FIG. 3 illustrates the interface circuit 6 waiting until it exits from reset at step 20. At step 22 the training mode is entered. At step 24 the interface circuit 6 samples the bi-directional serial signal at a sequence of points seeking to identify the training pattern of alternating values of 0 and 1. The sampling points will normally be defined by the clock signal being used within the integrated circuit 2, the sampling points being normally a fixed multiple or other derivative of this clock frequency.

At step 26 after the interface circuit 6 has sampled what it believes to be a full frame of serial data it tests that received pattern to see if it matches the training data pattern. If a match is not found, then processing returns to step 24 and the sampling continues. It will be appreciated that it is the responsibility, in this embodiment, of the external diagnostic device 4 to vary the data rate of the bi-directional serial signal until it can be properly received by the integrated circuit 2. This generally accords with the principle of offloading the complexities of diagnostic operation provision into the external devices 4 rather than having to provide these within the integrated circuit 2.

When step 26 identifies that the training pattern has successfully been received, then step 28 serves to pull down the serial data value during the continue bit period to a zero level. The continue bit normally floats at a level corresponding to a one unless it is actively pulled down by the integrated circuit 2 itself. The pulling down of the continue bit during the training mode, i.e. after an initialisation, signals to the external diagnostic device 4 that the integrated circuit 2 has been successfully trained to the bi-directional serial signal data rate of the external device 4 and is now capable of communicating via the interface circuit 6. At step 30 the training mode is exited and at step 32 the data mode is entered.

Figure 4:
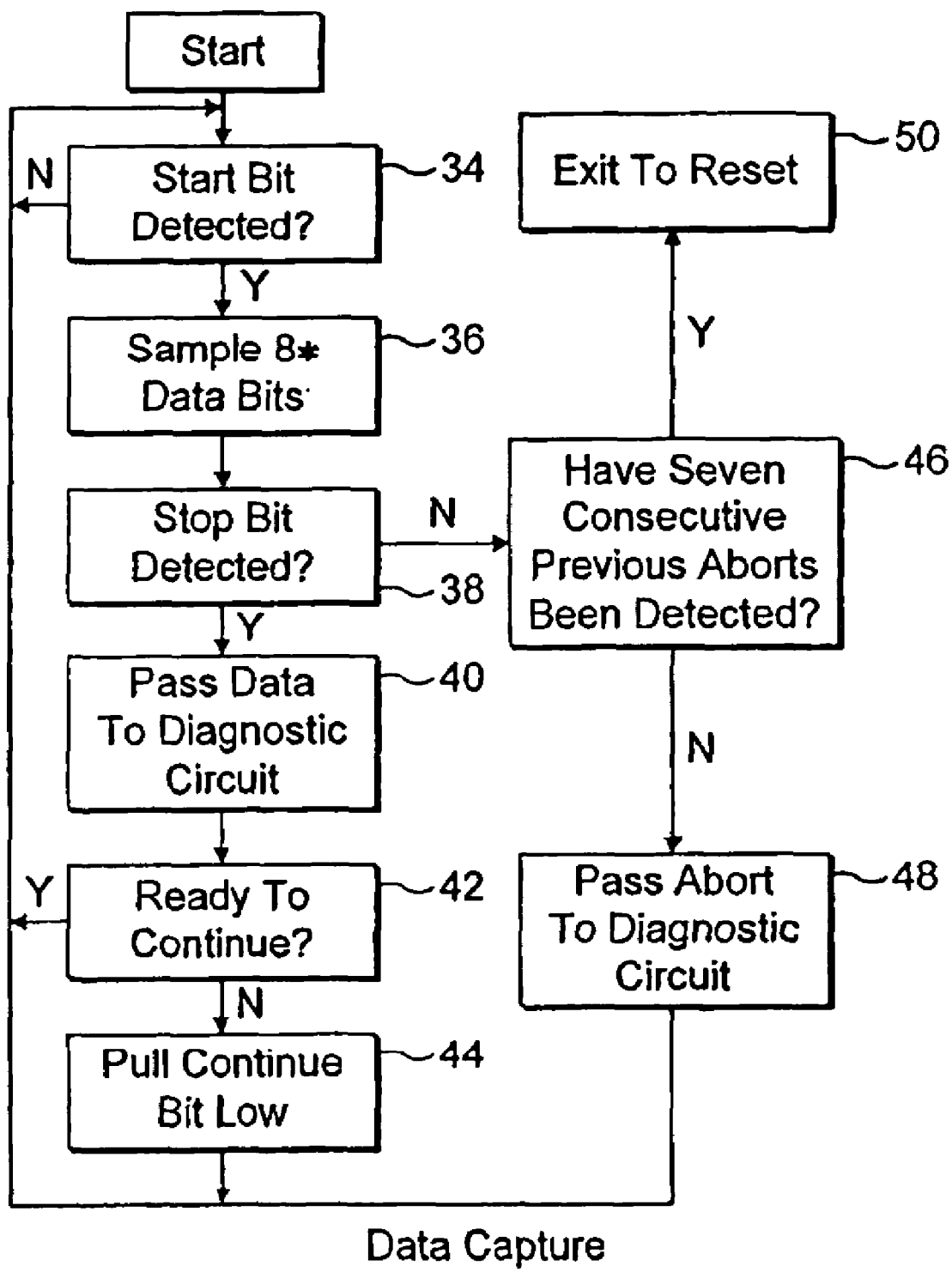
FIG. 4 is a flow diagram schematically illustrating the data capture operations of an integrated circuit.

FIG. 4 is a flow diagram schematically illustrating the operation of the interface circuit 6 during the normal data capture mode. At step 34, the circuit 6 interface waits for receipt of a start bit at the beginning of a serial data frame. A start bit is always, in this example, a value of zero. Accordingly, if the external diagnostic device 4 holds the bi-directional serial signal level at a one, then the interface circuit 6 will continue to wait for a start bit and will effectively be held idle.

Once the start bit has been detected, processing proceeds to step 36 at which eight data bits are sampled using the sample timings established in the training mode described in relation to FIG. 3. Following this, step 38 serves to detect whether a stop bit, which, in this example, always has a value of one, is present. The presence of the stop bit can be used as a check for the frame being properly received and can also be used by the external diagnostic device to effectively abort the serial data preceding the stop bit.

If the stop bit is successfully detected, then step 40 serves to pass the eight data bits to the diagnostic circuit 8. These eight data bits may be data values to be supplied to the integrated circuit 2 as stimulus, or control instructions for the diagnostic circuit 8 to configure its actions, or may have other uses. It will be appreciated that when the state of the diagnostic circuit 8 is such that the diagnostic operation required is the passing out of data from the integrated circuit 2 to the external diagnostic device 4, then instead of sampling eight data bit values at step 36, the interface circuit can instead assert appropriate data bit values it wishes to pass out to the external diagnostic device 4 with these then being detected and recorded by that external diagnostic device 4.

Following step 40, step 42 determines whether or not the interface circuit is ready to continue. It may be that the diagnostic circuit is busy performing a diagnostic operation, which may be a complex operation, requiring a relatively long time to complete, and it is inappropriate for further data to be sent from the external diagnostic device until that operation is completed. The further data from the external diagnostic device 4 may be an instruction for a following diagnostic operation, it not being possible to start this until the preceding operation has stopped. If the interface circuit 6 is not ready to continue, then processing proceeds to step 44 at which the interface circuit 6 forces the serial signal level to a zero during the continue bit period. This indicates to the external diagnostic device 4 that the serial communication should not continue. Processing then returns to step 42 until the interface circuit 6 is ready to continue.

If the determination at step 38 was that the stop bit was not properly detected, then processing proceeds to step 46. Step 46 determines whether seven consecutive immediately preceding aborts (none assertion of the stop bit) have occurred in which case this will be the eighth and a reset is triggered at step 50. If the test at step 46 is not met, then step 48 passes an abort to the external diagnostic circuit.

It will be appreciated that the training pattern signal levels with particular meaning and other features of the serial data protocol could all be varied whilst still embodying the present technique.

A further description of the bi-directional serial communication referred to above is given in the following:

Terms and Abbreviations

The following description uses terms and abbreviations as specified:

| Term | Meaning |
| --- | --- |
| SWO | Single Wire Output. An application specific trace component (not to be confused with general trace, which is processor specific). |
| DBT | This is a TAP block which acts as an AMBA (AHB or AHB-Lite) master for access to a system bus. It may optionally also provide scan chain access. |
| AMBA | The ARM Bus standard within a chip. |
| JTAG | IEEE Joint Test Access Group specification for 4-6-wire interface to control a serial interface to scan chains. JTAG is used for debug as well as test. SWJ is based on the underlying debug JTAG model. ScanTAP is based on the test part of JTAG. |
| Emulator | A misnomer, used to refer to a run control box (piece of HW) attached to a chip for debug. Normal emulators are JTAG based. A box connected to a SWJ interface would also be called an emulator for historical reasons. |
| OCRC | On-Chip Run-Control component of SWJ. This provides the actual protocol handling and interface to DBT and scan chains. |

Introduction

This is a proposal for a small single-wire JTAG component. The SWJ component is used to debug and test ARM based processors (including multi-core) using a single wire interface instead of the typical 4-6 wire JTAG interface. The single wire interface literally uses one wire for communication in both directions. The high-speed SWJ support requires visibility to an additional signal/pin, which contains a clock (but it does not have to be a clock dedicated to SWJ). The clock (which can be divided against) allows high speeds by providing a clean edge for sampling.

The non-clocked mode allows up to about 3 MHz speeds (data rate is $8/11^{th}$ of that speed). The clocked mode allows up to about 40 MHz rates (data rate is $8/11^{th}$ of that speed). The general wire protocol is framed serial with 1 start, 1 stop bit, a continue bit for each 8 data bits. A held stop bit allows unlimited idle time. A held 0 is a bus reset. The emulator drives the interface, with the continue bit indicating when return data is provided by the target. This allows the emulator to pend until the target indicates completion of an operation. So, unlike JTAG, the emulator can be paced properly.

The other part of SWJ is the On-Chip Run-Control (OCRC). The OCRC supports the protocol used for DBT access, JTAG access, and optionally direct scan chain access (via DBT). The OCRC has allowances for special ROM constant strings to enhance the performance of any TAPs in the system (cores, devices, etc). In general OCRC's protocol is highly optimised for SWJ to insure highest possible speeds. In general, this will usually mean that SWJ will be much faster than straight JTAG at the same speed grades.

In reviewing the SWJ electrical interface, it is important to note that the design was carefully chosen to minimise costs to the target and to allow for very low cost emulators. In general, SWJ allows for choice of emulator classes to balance costs against speed. So, a low-end pin-starved MCU will be able to use a very low cost emulator and a high-end fast part will be able to use a much more powerful emulator. But, the interface is designed to support the low and high speed forms (non-clocked and clocked), so that either emulator can be used for both parts.

SWJ Electrical Design

Figure 5:
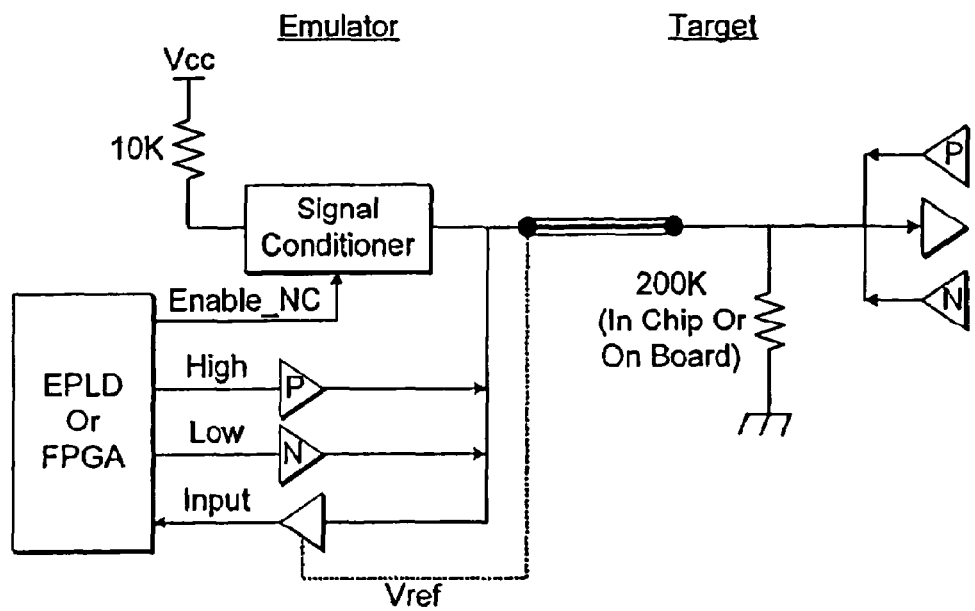
FIG. 5 is a diagram schematically illustrating an integrated circuit incorporating a diagnostic bus-master circuit in non-clocked mode for issuing bus transactions to carry out diagnostic operations upon an integrated circuit.
Figure 6:
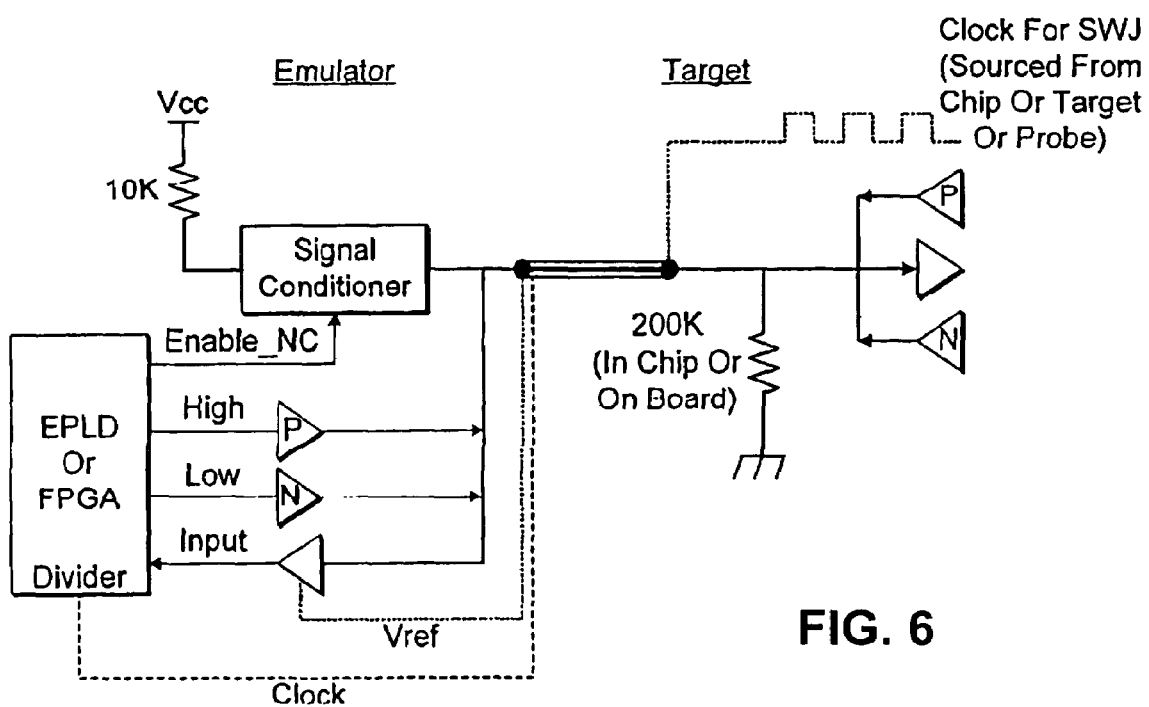
FIG. 6 is a diagram schematically illustrating an integrated circuit incorporating a diagnostic bus-master circuit in clocked mode for issuing bus transactions to carry out diagnostic operations upon an integrated circuit.

FIG. 5 shows the block diagram of a non-clocked connection. FIG. 6 shows the block diagram of a clocked connection. All emulators must support non-clocked mode, but clocked mode is optional. This is because SWJ always comes up in non-clocked mode (from reset). The circuits are designed to make switching between the two trivial for both the emulator and target.

Note that the 200K pull-down resistor on the target side may be in the chip or on the board.

Non-Clock Mode Electrical Details

The non-clocked mode signal conditioner in the emulator is used to snap the signal from LOW to HIGH quickly. The 10K resistor will only float the signal to HIGH, but the signal conditioner (bus hold style feedback circuit) will detect the current flow change and drive the signal to HIGH until past RMS. At that point, it will drop out and allow the 10K resistor to keep the signal HIGH. The shape of edge will be clean enough for the lower speeds (3 MHz or less) of non-clocked mode.

For very low-end parts, it is possible to use the non-clocked pull-up model to power the SWJ debug end of the part. This will not be the normal model, but is feasible using capacitance drain.

Clock Mode Electrical Details

The target will normally supply the clock for clocked mode. The clock may be from the chip (output), or from the target board into the chip (input). It is possible also to construct a pod (emulator connection) which generates the clock via crystal or PLL, but the emulator will not ever generate the clock directly. In any case, it does not have to be a dedicated clock for SWJ (can be shared for other uses), but it does have to be clean.

It is assumed that the clock will be divided in most cases; it is suggested to keep the clock in the 10 MHz to 100 MHz range. Any dividing is agreed and determined while still in non-clocked mode using the command protocol. The reason for using a divider is that the same clock can be used for high speed SWO (or other purposes), which would want a faster clock source. The protocol of SWJ defines how to use a divided clock cleanly. Note that SWJ must use the clock as its clock source (although this can be switched when going between clocked and non-clocked mode). The reason for this model (vs. sampling) is that the clock edges are used to support the bi-directional interface on a single pin.

Wire Protocol for SWJ

The SWJ wire interface is based loosely on the RS-232 model (whether clocked or not). Each 8-bit data packet is framed with 1 start bit and 2 stop bits. But, the $2^{nd}$ stop bit is really a special reply marker as explained below. The format is:

| 0=start | 8-bits of data (either direction) | 1=stop | 1=continue, 0=not-continue |
| --- | --- | --- | --- |

The significant difference is the $2^{nd}$ stop bit. This $2^{nd}$ bit is left high when the packet is accepted and the emulator should continue. It is driven low when the packet should be resent. This mechanism allows the target to pace the emulator to the speed it can handle. This pacing can be used both for byte-by-byte management (such as when the SWJ clock speed is faster than a core (at say 32 KHz)) as well as operation completion (such as a DBT memory transaction).

Note that for non-clocked mode, the target simply leaves the line high (active pullup) if CONTINUE, else pulls low. For clocked mode, the target must hold high for CONTINUE, else pull low.

Wire Protocol Modes and States

In general, there are 4 wire protocol modes or states:
1. Reset. This occurs when the wire is held low for 8 or more packets. The target detects this because the stop bit is missing. This is called an alert. If more than 8 alerts are detected, the target can assume a reset of the interface has been asserted (this has no effect on anything but SWJ). The SWJ interface reverts to non-clocked mode. Note that not having an emulator connected will cause a reset due to the pull-down resistor.
2. Training—only in non-clocked mode. After a reset, the emulator sends a data packet with 0x55 (0b01010101). The target uses this to auto-baud on the non-clocked sequence or to verify the divider on a clocked system. The training packet will continue to be sent when the $2^{nd}$ stop bit is set to CONTINUE (1). Training mode will be exited when the $2^{nd}$ stop bit is set to NOT CONTINUE (0). If more than 8 CONTINUE bits are detected by the emulator, it may choose to try reset again and then run the speed slower for the training mode. This will accommodate the case of a very slow chip (which cannot over-sample enough at 3 MHz non-clocked mode).
3. Data. The data mode is the normal packet mode. This mode is entered after leaving training mode. Between each data packet may be idle states (if the stop lasts longer than 1 clock). So, introduction of a start bit always restores to normal data mode and data state.
4. Idle. An idle state is the line held in stop state (no start sent). This means that the pin is held high. The idle state can be held as long as needed. It is exited by the introduction of a start bit. In non-clocked mode, the start bit comes out at the next natural internal clock point (to the emulator). In clocked mode, the start comes out on a clock edge.

Reset Mode

The reset mode is defined as 8 or more packets with a deasserted stop bit (stop is 0 instead of 1). In other words, 8 packets worth of abort causes a reset.

The definition of what actions to take on reset are specific to SWJ and the OCRC block. The main intent is to clear the line only, so aborting any pending OCRC mode/command is the main objective as well as clearing any internal state of the SWJ block.

Training Mode

Training mode is only entered after reset. The training command is 0x55 as data. Training mode is only exited when the target drives the $2^{nd}$ stop bit low. This allows the target time to auto-detect the baud rate (speed of data clock in non-clocked mode) as well as to insure that the target can train on the data. If the data clock is too fast, the $2^{nd}$ stop bit will be left in the floating high state—this allows the emulator to detect that the target cannot train (and so can try lower speeds).

| Start=0 | 1 | 0 | 1 | 0 | 1 | 0 | 1 | 0 | Stop | CONTINUE(1/0) |
|---|---|---|---|---|---|---|---|---|---|---|

Data Mode

Data mode follows immediately after training mode is exited via the NOT CONTINUE bit (0). Data mode is the normal operating mode for SWJ whether clocked or non-clocked. Data mode allows issuance of commands at the level above SWJ wire protocols. Data mode commands include commands aimed at the SWJ interface as well as ones routed to parts of the On-Chip Run-Control (OCRC) block. The main SWJ data mode commands include:

Get ID—reads back the ID of the SWJ module. This may change to an OCRC command. This command will also indicate if clock mode is possible.

Set clock mode divide counter. This command allows setting the counter and then committing the switch to clocked mode. The switch to clock mode is followed by 8 packets worth of idle state (see below) and then a GetID command in clocked mode. If the GetID command fails, the emulator may use reset to revert to non-clocked mode.

Abort OCRC current action. In the event of continuous NOT CONTINUE responses from the SWJ interface on a data command, the emulator may use the Abort command to request that OCRC abort its current action (if possible) and return to a known state. Note that Abort is the same command in all subsystems as it is in SWJ.

The main OCRC commands include:

Get ID—reads back the SWJ and OCRC ID information. This information includes version of the blocks as well as information on the system design parameters (including whether clocked mode supported, if DBT ScanTAP is supported, if JTAG access is supported, and if DBT MemTAP is supported).

Select DBT MemTAP. This selects the MemTAP for command feed. Until exited (via MemTAP exit request or Abort), the commands that follow are fed to the MemTAP component. Note that Abort is the same command in all subsystems as it is in SWJ. Thereafter feeds 34 bit data and optimising commands (such as multiple 32 bit data with the same 2 bit extension, repeats, etc).

a Select DBT ScanTAP. This selects the ScanTAP for command feed. This operates in the same manner as MemTAP command feed.

Select JTAG command. This selects the JTAG wrapper within OCRC. This allows feeding of JTAG operations for systems where a JTAG chain is in use. The commands that are sent to this unit are designed to optimise JTAG traffic, including driving TCK sequences, optimised Shifts, and ROM-constant feeds for common operations applicable to the TAPs in the system (so controlled by a system designer).

Select Other command. This selects other OCRC command feeds—reserved.

An example data mode command looks like:

| Start=0 | 1 | 1 | 0 | 0 | 0 | 1 | 0 | 0 | Stop=1 | CONTINUE(1/0) |
|---|---|---|---|---|---|---|---|---|---|---|

Which has value of 0x23. The CONTINUE bit will be left at 1 if the byte is accepted and driven low if needs to be repeated. That is, the NOT CONTINUE bit state indicates that the byte (0x23) was not accepted by the target and should be sent again (and again if still not accepted). This forms the pacing mechanism.

Note that the CONTINUE or NOT CONTINUE indicator can occur for any of 3 reasons:

The OCRC clock rate is too slow to accept the next byte in general (clock rate of OCRC is same as system, whereas clock rate of SWJ may be different).

The OCRC or sub-system is still processing the previous byte (such as running TCKs, bus operations, or scans).

The OCRC is doing a repeated test (such as reading a scan chain and comparing against an expected value).

These three reasons allow pacing of the raw data rate (how fast the emulator can feed bytes in general), the command completion rate (how fast the sub-system can execute the command itself), and complex operation rates. The pacing can change dynamically based on changes in internal clock rate as well as changes in type of operations (some forms of memory may be slower than others, for example). This forms a powerful part of the SWJ strategy, and helps SWJ to be much faster than straight JTAG in many cases (where polling and pacing issues cause many problems).

Idle State

Idle state is a state within Data mode. The idle state forms a gap or filler between data packets. The emulator simply holds the stop state (high) for as long as wanted before introducing the next packet (as indicated by the start bit which is low).

| ... Stop=1 | 1 | 1 | 1 | ... | 1 | 1 | 1 | Start=0 | Command... |
|---|---|---|---|---|---|---|---|---|---|

SWJ and OCRC Fitting Into System

Figure 7:
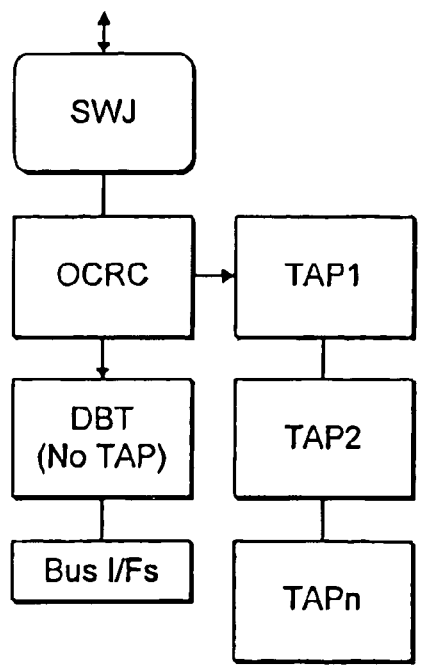
FIGS. 7 and 8 illustrate aspects of a communication technique for use between an external diagnostic device and an integrated circuit.
Figure 8:
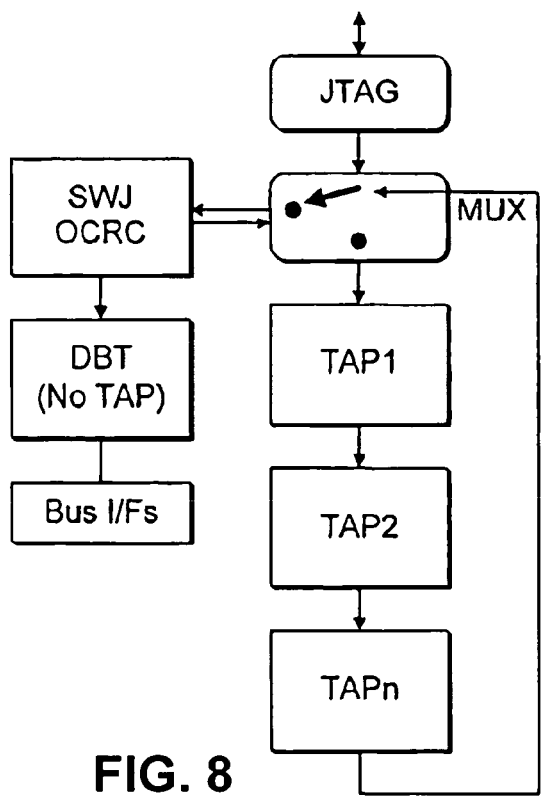

FIGS. 7 and 8 show how SWJ and OCRC can fit into the system. FIG. 7 shows the standard SWJ model for a system with JTAG TAPs (including ARM EICE). FIG. 8 shows a novel hybrid SWJ model, which allows existing JTAG systems to work with the same chip. An SWJ emulator can switch the target over to SWJ from JTAG using a fixed sequence.

The arrangement of FIG. 7 uses SWJ to access DBT (MemTAP and possibly ScanTAP) and a JTAG scan chain (such as for ARM EICE blocks as well as other devices).

The arrangement of FIG. 8 uses a hybrid approach for vendors who must have legacy JTAG support. $3^{rd}$ party vendors can continue to plug in JTAG emulators and support the TAPs as usual. New generation emulators send a specific JTAG sequence (an unused IR to one TAP) to switch to SWJ. This reuses the same pins (3 of them) with TCK unused (to prevent problems) and nTRST also unused (if wired at all). The model for this is that TMS is the SWJ data signal, TDO is the SWO signal if used, and TDI is the clock source if clocked mode is supported. A SWJ emulator can detect if in JTAG or SWJ mode by holding TCK low and driving TMS through the reset and then Training mode. If the $2^{nd}$ stop bit is not driven low after 8 packets, the emulator can assume that it is somehow back in JTAG mode (since TCK is held low, JTAG does not care if you change TMS). In the event it is in JTAG mode, the emulator drives a 1 based pattern to detect the IR length and then sends a fixed pattern to the $1^{st}$ TAP in the scan chain with the unused ARM EICE IR sequence—this then switches the target into SWJ mode. After it is in non-clocked SWJ, the emulator can switch to clocked SWJ mode if supported. It can also support SWO output on TDO. Note that the emulator does not have to be a full JTAG emulator to do this minimal set of operations.

Details of another embodiment of the present techniques is given below. Some of the elements of the previously described embodiment have been renamed and/or relabelled in the following description. In particular, SWJ becomes SWD, DBT becomes AP and OCRC becomes DP. Other changes include longer frames (4× the data, more header to handle parity and safety) and an inversion of the training model.

This description uses the following terms and abbreviations.

| Term | Meaning |
|---|---|
| AMBA | Advanced Microcontroller Bus Architecture. The ARM on-chip communications standard for designing high-performance embedded microcontrollers. |
| AHB | Advanced High-performance Bus. |
| AHB-AP | AHB Access Port. An optional component of the DAP that provides an AHB interface to a SOC. |
| AP | Access Port. This serves as a master to provide access to the system bus (AHB or AMBA) and optional access to the scan chains. This is comparable to the term DBT used in describing the previous embodiment. |
| APB | Advanced Peripheral Bus. Part of the AMBA hierarchy of busses optimized for minimal power consumption and reduced interface complexity. |
| APB-AP | APB Access Port. An optional component of the DAP that provides an APB interface to a SOC. |
| CoreSight | ARM's Debug and Real-time Trace technology. Includes all the logic for monitoring, tracing, and debugging a complete system on chip. |
| DAP | Debug Access Port. The DAP is the term used to encompass a set of modular blocks that support system wide debug. The DAP is a modular component, intended to be extensible to support optional access to multiple systems such as memory mapped AHB and CoreSight APB through a single debug interface. |
| DP | Debug Port. This provides protocol handling and interface to an AP. This is comparable to the term OCRC used in describing the previous embodiment. |

-continued

| Term | Meaning |
| --- | --- |
| Instrumentation Trace | A component for debugging real-time systems through a simple memory mapped trace interface, providing 'printf' style debugging. |
| JTAG-AP | JTAG Access Port. An optional component of the DAP that provides JTAG access to on-chip components, operating as a JTAG master port to drive JTAG chains throughout a SOC. |
| JTAG-DP | JTAG Debug Port. An optional external interface for the DAP that provides a standard JTAG interface for debug access. |
| SWD | Serial Wire Debug. A term for the debug system as a whole including its legacy JTAG capabilities and its new capabilities. This is comparable to the term SWJ used in describing the previous embodiment. |
| SW-DP | Single Wire Debug Port. An optional external interface for the DAP that provides a single wire, bi-directional debug interface. |
| SWJ-DP | Combined SW-DP and JTAG-DP. |

Introduction

Single Wire Debug provides an efficient mechanism for connecting an external debug interface to an embedded system. A single pin is required, compared with the 5 or 6 pins typically used by a JTAG interface. The interface is designed to allow the use of a simple, low cost host device to control the interface.

Structure

Figure 9:
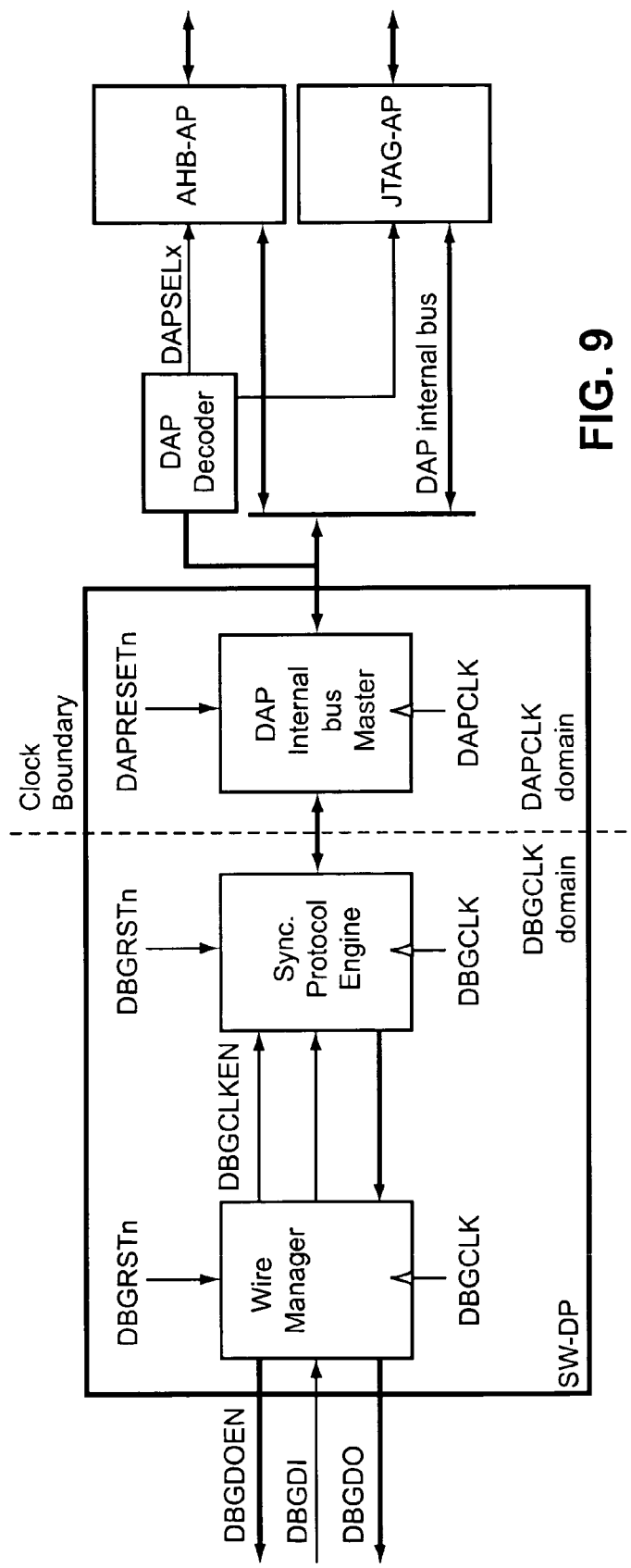
FIG. 9 illustrates a single wire debug port.

FIG. 9 shows that SW-DP is a bridge between an external serial interface and a DAP internal bus. There are three blocks, a Wire Manger (Asynchronous Encoder/Decoder), a Protocol Engine and a DAP internal bus interface. The Protocol Engine and DAP interface are common to SW-DP and JTAG-DP. This allows a dual-mode DP to be created (SWJ-DP) with minimal effort.

The Wire Manager's function is to enable asynchronous operation of the external serial interface. A bi-directional protocol operates over this interface, managed by the host device. The output from the wire manager is intended to be similar to the traditional JTAG interface.

The Protocol Engine manages the serial line protocol, and DAP level features like the address register and repeat counter.

The DAP internal bus interface constructs transactions to the internal bus interface, which then connects to one or more APs, driving the various on-chip buses to which the SW-DP has provided access. The DAP decoder is an address decoder, providing a select line for each AP in the system.

The design provides two clock domains, allowing the DAPCLK domain to be powered down or changed (if synchronous to core clock). DBGCLK will typically not be powered down if debut access is to be maintained, and should be at a fixed frequency if re-training is to be avoided. Additionally, an asynchronous boundary provides for more flexibility in the SW interface timing.

The Protocol Engine and Wire Manager reside in the same clock domain. There is a clock boundary between the Protocol Engine and DAP bus interface.

Clocking

SW-DP has two clock domains, which are completely independent of each other. Handshaking across the clock domains allows either clock to be much faster than the other. Each mode of operation has some specific clocking constraints for DBGCLK.

In either mode, the clock source can be on-chip or off-chip. It is more likely that an off-chip clock source will be used when synchronous mode is being used. In synchronous mode, the external Debug and Test Controler (DTC) needs access to the same clock as a timing reference.

Asynchronous mode

The ideal mode of the wire interface is asynchronous, and it is assumed that the wire will be oversampled to extract the data. The speed at which the link can be operated will often be restricted by the external pads and wiring, with a higher frequency available on-chip.

In order to simplify the requirements for the training sequence, the baud-rate range must be known by the DTC. In order that the interface is operable with a generic DTC, the baud rate at reset is constrained to be within the range 50 kbaud to 8 MBaud.

In order to support asynchronous mode, the system designer must ensure that DBGCLK is stable for long enough periods to allow adequate debug performance. In an environment where dynamic clock frequency changes are expected, it is recommended that the system provides a default clock which is reliable, and a mechanism for switching DBGCLK to a higher frequency when dynamic clock switching is disabled.

There is no requirement for a DLL or PLL to be dedicated to the Single Wire debug port. If the design already contains a high frequency oscillator as a CPU clock source, it may be possible to re-use this as a source for DBGCLK.

Although the clock needs to be a higher frequency to enable over sampling of the data on the wire, it is likely that practical constraints on the external interface are more limiting than the available highest clock frequency.

Synchronous mode

Synchronous mode, while requiring an additional connection to the DTC, provides two separate advantages. It simplifies system and DTC design issues and separately permits operation at higher data rates.

In synchronous mode, the supplied DBGCLK does not need to be at a well-defined frequency. It is, however, necessary that the clock is free-running since some of the DP functionality relies on DBGCLK. When the DP is idle, the clock can be stopped, but the clock should not be stopped immediately after the final data bit has been transmitted over the wire. The number of additional clock cycles required after a transfer is TBD.

Speed

SW-DP supports the following maximum speeds with TSMC 0.13 Sage-X Artisan libraries:

DAP internal bus speed of 166 MHz (DAPCLK)

160 MHz sampling clock on the external Single Wire interface. (DBGCLK)

SW-DP is expected to be used with DBGCLK in the range 1 MHz to 160 MHz without requiring any specific clock knowledge at the host. Synchronous mode has no lower frequency limit.

The external baud rate is expected to be limited by packaging and connection to the debug tools. The bit rates achievable with synchronous and asynchronous modes on the external interface are expected to be comparable, asynchronous mode only requiring the availability of a higher frequency clock source on-chip. Current technology allows the use of JTAG interfaces at typical speeds of 10 MBaud, and a highest achievable frequency of approximately 50 MBaud. This range should be representative of single wire technology as well.

In order to facilitate baud-rate detection, specific requirements are placed on operating baud rates. Any host device is required to support a baud rate range between 50 k baud and 8M baud in asynchronous mode. Optionally, a host may run at up to 32M baud (limited by the 160 MHz DBGCLK), although achieving this speed in practice may be difficult. Higher speeds are only expected to be used in controlled environments, e.g. factory test equipment.

The clock boundary between the wire interface and DAP internal bus interface is managed by a registered interface, and through double-flopped handshake signals.

Power

The SW-DP must draw negligible power whilst idle. It is likely that the port will be connected whilst the target is in sleep mode. In order to minimise power consumption, the host should be able to hold the wire HIGH (i.e. reset) when it is known that the target is in sleep mode. This allows almost all of the logic in the SW-DP to be stopped, but does require a training sequence before the port can be activated.

Size

The target size is quoted for a scan inserted implementation in TSMC 0.13 Sage-X Artisan libraries, targeted at 50 MHz clock frequencies.

SW-DP 5.0 k gates.

Performance

Performance is discussed only for asynchronous mode. Synchronous mode provides slightly higher throughput for any particular baud rate since the packet length is shorter.

A system using SW-DP must be able to achieve a data throughput improvement over a similar system using a JTAG interface, assuming the same wire baud rates. Where an AHB-AP or APB-AP is used, download speed will be limited by the wire data rate, since transfers on the AMBA buses are 32 bits wide. Where a JTAG-AP is used, either the external interface or the internal interface could be the limiting factor, and handshake between the two is likely to further decrease the throughput of the link. An on-chip JTAG connection would be operated at a higher clock frequency than the wire bit rate, in order to increase the throughput.

To calculate the performance, it is assumed that that 5 times oversampling the wire will be adequate.

Each SW-DP transaction, providing a payload of 32 bits of data and 2 bits of address will take up to 50 symbols (reads are 49). For a block transfer, one address, a status read and a control write is required every 1024 words. Exact values will depend on how efficiently the protocol is used.

For a typical MCU application, using a 40 MHz DBGCLK, this gives a baud rate of 8 MHz.

The useful data rate is then:

$$8e6*32/50*1024/1027=5.1 \text{ Mbit/sec.}$$

This is approximately equivalent to the throughput which is achieved using JTAG (500 k byte/sec, at 10 MHz clock), whilst only requiring a single package pin. Adding a clock pin would reduce the protocol overhead slightly and allow a line rate equal to the clock frequency, up to the limits imposed by noise and timing accuracy.

To determine the maximum achievable throughput for a single wire interface, it is necessary to make assumptions about the maximum wire frequency which can be sampled reliably, using simple synchronous clocked design techniques, and the level of degradation which can be expected on the signal. Again, this will be investigated with prototyping.

If a line rate of 25 Mbaud could be achieved, this would provide a useful data rate of:

$$25e6*32/50*1024/1027=16 \text{ Mbit/sec.}$$

This also assumes that the host device is able to provide data fast enough, and the protocol supports data being streamed continuously. Current generation tools are likely to be the limiting factor in this scenario. The 25 Mb/s rate would require a DBGCLK of 125 MHz.

A session which transfers random data is likely to achieve less than 50% of the bulk download rate. Provided that the target is using a clock of at least 40 MHz, SW-DP should provide a debug session which is at least as responsive as a traditional JTAG debug session.

Functional Overview

The operating mode of the Single Wire interface provides read/write access to a group of 4 addresses within an AP. Each access will transfer 32 bits of data. The behaviour of any specific AP is implementation defined, but it is likely to provide both a configuration interface and a data transfer interface.

The collection of APs within the Debug Access Port (DAP) and the DP are together used to provide external access to the whole on-chip system (or a sub-set of the system), typically using a number of low-level wire transfers to configure and generate a debug transfer in the system.

The single wire protocol defines how control and data bits are used to control the link and select a register bank within a target AP, and perform data transfers to that AP.

Each transfer is initiated by the device controlling the link (either DTC or router), and consists of a header, target response and data payload.

The header contains the following information:

DP/AP Select—Determines the destination of the transfer

Read/Write—Determines the direction of the payload

Address—2 bit address encoded in each packet

The target response allows the following encodings:

OK—The transfer can be accepted

WAIT—The TS is busy handling a previous request.

FAULT—A flag bit is set in the TS, which must be cleared before proceeding.

ERROR—Protocol error detected.

When the TS responds with an OK response, the transfer finishes with a 32 bit data payload.

If the TS response is anything other than OK, the transfer has no effect on the TS. The other responses are specified to permit the speed of the link to be de-coupled from the on-chip system performance, and optimise transfer responsiveness. Different classes of DTC may treat the different responses differently.

Port definitions
DAP Bus Interface
Description

The internal bus supports the connection of a single DP to multiple APs. The internal bus—the DAP bus, is not an AMBA bus, and only supports the connection of APs.

Note that this is not an open bus, rather a method of supporting the connection of a single DP to multiple APs in any required configuration. Table 1 shows the DAP bus interface signals. The direction of the signal is relative to the driving DP. Hence the direction is reversed (DAPCLK and DAPRESETn excluded) for the APs.

DAP Bus Port List

TABLE 1

SW-DP interface definition

| Port Name and Size | Direction | Description |
|---|---|---|
| DAPRESETn | In | DAP DP Reset - should be driven by active LOW Power on Reset |
| DAPCLK | In | DAP Internal APB Clock |
| DAPCLKEN | In | Enable term for DAPCLK domain |
| DAPABORT | Out | Abort the current transfer. The AP returns DAPREADY HIGH and aborts any transactions in progress if possible. Some AP registers may also be reset. |
| DAPSLVERR | In | AP slave error response |
| DAPADDR[31:2] | Out | DAP address bus |
| DAPSEL | Out | The master select used by the decoder to generate DAPSELx |
| DAPENABLE | Out | The enable signal is used to indicate the second and subsequent cycles of a DAP transfer from DP to AP. |
| DAPWRITE | Out | When HIGH indicates an DAP write access from DP to AP and when LOW a read access |
| DAPWDATA[31:0] | Out | The write bus is driven by the DP block during write cycles (when DAPWRITE is HIGH) |
| DAPRDATA[31:0] | In | The read bus is driven by the selected AP during read cycles (when DAPWRITE is LOW) |
| DAPREADY | In | The ready signal is used by the AP to extend a DAP transfer. |

Single Wire Interface
Description

The Single Wire interface has 3 pins for data, which must be used to drive a bi-directional pad for the external interface and clock and reset signals. Externally a maximum of 2 pins are required, a bi-directional SWDIO signal, and a clock (which may be input or output from the device). DBGRESETn may be driven from the power-on-reset signal in the chip.

Port List

TABLE 2

Single wire port connections

| DBGRESETn | In | Debug Reset (Serial interface) |
|---|---|---|
| DBGCLK | In | Debug Clock (Serial interface) |
| DBGDI | In | Debug Data In (Serial interface) |
| DBGDO | Out | Debug Data Out (Serial interface) |
| DBGDOEN | Out | Debug Data Out Enable (Serial interface) |

Clock/Reset Control interface
Description

Within the DBGCLK clock domain, there are registers provided to allow power control for the on-chip debug infrastructure. This allows the majority of the debug logic (ETM, ETB, etc.) to be powered down by default, and only the wire manager/serial engine need to be clocked. A debug session would then start by powering up the remainder of the debug components.

See section Error! Reference source not found. and Error! Reference source not found. for timing details of the Clock/Reset control interface.

Port List

TABLE 3

Power/Reset controller port connections

| CDBGPWRUPREQ | Out | Debug power domain power up request |
|---|---|---|
| CDBGPWRUPACK | In | Debug power domain power up acknowledge |
| CSYSPWRUPREQ | Out | System power domain power up request |
| CSYSPWRUPACK | In | System power domain power up acknowledge |
| CDBGRSTREQ | Out | Generate a debug reset request to the reset controller |
| CDBGRSTACK | In | Acknowledgement of the reset request from the reset controller |

Pad Interface

Figure 10:
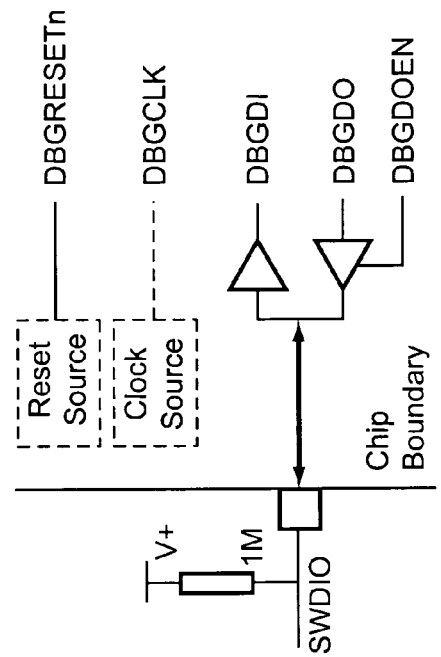
FIG. 10 illustrates single wire debug port external pads.

The system integrator must take the serial interface from the Wire Manager, and add a pad wrapper for bi-directional pads. A sample wrapper would be:.
  assign DBGDI=SWDIO;
  assign SWDIO=DBGDOEN?DBGDO: 1' bz;

FIG. 10 shows how the internal nets correspond to external pads.

The single wire pad should, where possible, be current limited at (TBD) 10-20 mA.

DBGCLK will typically be generated by an internal clock source, and will often be the main internal bus clock for the SoC. DBGCLK must remain stable through a debug session if re-training is to be avoided. Re-training will occur if the clock frequency changes, but this is a relatively lengthy process (of the order of 0.5 sec). Although it is possible that a change in DBGCLK frequency will result in data corruption, this is unlikely. Even if the change occurs in the data part of the transfer, there are 3 bits which must be sampled correctly for the transfer to be accepted.

The Wire Manager state machine senses line reset conditions, detects start bits, and performs the data sampling. The Wire Manager implements the bi-directional line protocol, interfacing with two serial data streams from the serial protocol engine.

Specification

Wire Manager Description

The SW-DP provides a single wire debug interface to the DAP internal bus. It is a single pin replacement for a JTAG interface (JTAG-DP), supporting bi-directional communication.

The protocol is mastered by the host, with a sequence consisting of request header (always generated by the host), acknowledgement (from the target) and data (from either host or target).

Each sequence consists of a 4-bit header, an acknowledgement and a 32-bit payload, which may be suppressed by the acknowledgement. Extra bits are used to provide timing information and allow the transmissions to be checked for timing and data errors. Turnaround periods are inserted when control of the line passes from host to target, or target to host. The length of the turnaround period depends on physical characteristics of the I/O pad, and may be several bit periods at high clock rates.

Transfers can be signalled as reads or writes, and addressed to either SW-DP registers, or AP registers. The AP which is selected must be configured by writing to a SW-DP register.

Two bits of address are encoded into the protocol header. These map either to the SW-DP registers, or decode to the lower 2-bit portion of the DAP internal bus address DAPADDR[3:2]. This allows banks of 4 AP registers to be addressed without having to re-configure the SW-DP.

Every header is followed by an acknowledgement from the target, which allows the transfer to be rejected before the payload is transmitted by either target or host depending on the direction of transfer indicated in the header. The acknowledgement can be used to indicate either that the target is temporarily busy, or that it needs to report some status and will only respond to a special sequence from the host.

Serial accesses are buffered so as to improve throughput by hiding handshakes within SW-DP and between SW-DP and the DAP internal bus.

Line Interface

SW-DP uses a single wire for both host and target sourced signals. The host emulator drives the protocol timing—only the host emulator generates packet headers. Bit level timing is determined by the target. The host is required to synchronise its clock frequency to the target. This may be achieved by using a programmable clock generator, or fractional division to generate a sampling clock. An initial training sequence is used to discover the clock frequency.

The initial implementation of SW-DP will be synchronous mode, requiring a clock pin as well as a data pin. Future versions are expected to include an asynchronous mode, which requires a more robust wire protocol. Synchronous mode removes the need for the host to synchronise to the target clock frequency, and removes the constraints on the wire baud rate which are necessary to permit synchronisation.

The asynchronous mode uses a single pin to encode just data. This requires that the host makes an accurate measurement of target frequency, and that the free-running sampling clocks stay within sync during a 37 bit packet. In order that the target can detect the start bit edge, and then sample data in the middle of each bit, over sampling of the data is required. The host is also expected to over sample to extract data. The host will need to generate a clock reference which is accurate to better than ~0.5% of the target's frequency in order to ensure that the sampling point drift over a packet (37 bits) is less than one sampling period.

Since it is possible for the target clock frequency to change, or drift out of synchronisation, two check bits are added to the end of each transmission. The first is a parity bit, the $2^{nd}$ a fixed state. The combination of these two bits significantly reduces the chance of mis-sampling the header without detecting that it is invalid.

In order for the asynchronous mode to work properly, a reasonably low noise environment is required. Only one timing reference is used to decode a sequence of bits, and there is no mechanism for correcting errors. It is important that occasional errors can be detected (either incorrect time-alignment or corrupted bits) so as to prevent contention when a write is mis-interpreted as a read, and that the error rate is sufficiently low as to not impact the overall throughput when the delay taken to retrain is taken into account. With a low error rate, adding a single parity bit provides useful protection against occasional errors, and allows a packet with a corrupted bit to be re-sent, provided the framing information is correct. It should be noted that in addition to the parity bit, each data phase includes two fixed bits which allow for accurate checking of clock frequency on a per-packet basis. Although it is possible for corrupted data to reach the target system, this will be a very unlikely occurrence (provided that the interface is not being operated beyond the intended range of operating conditions)

The synchronous mode uses a clock reference signal, which may be sourced from an on-chip source and exported, or provided by the host device. This clock is then used by the host as a reference for generation and sampling of data such that the target is not required to perform any over sampling. This allows any specific data rate to be achieved with a lower clock frequency at the target. The synchronous mode is the preferred mode for the first implementation, since this permits very simple tools to be created.

Both the target and host are capable of driving the bus high and low, or tri-stating it. The ports must be able to tolerate short periods of contention to allow for synchronisation being lost.

Line Pullup

Both the host and target are able to drive the line high or low, so it is important to ensure that contention will not occur by providing un-driven time slots as part of the hand-over. In order that the line can be assumed to be in a known state when neither is driving the line, a 1 M Ohm pull-up is required at the target, but this can only be relied on to maintain the state of the wire. If the wire were driven low and released, the pull-up resistor would eventually bring the line to the high state, but this would take many bit periods.

The pull-up is intended to prevent false detection of signals when no host device is connected. It must be of a high value to reduce IDLE state current consumption from the target when the host actively pulls-down the line. A pull-up is specified to allow the SWD data pin to be shared with a JTAG TDI pin.

It should be noted that whenever the line is driven low, this will result in a small current drain from the target. If the interface is left connected for extended periods when the target has to use a low power mode, then the line must be held high (reset) by the host until the interface needs to be activated.

Asynchronous Operation

Data is transmitted without any additional encoding, along with a clock. The wire is sampled at a rate of 5 samples per symbol, and low-pass filtered by taking the majority value from 3 consecutive samples. Synchronisation (start and resume) bits are inserted in the packet format to provide alignment for the start of a packet, providing a rising or falling edge at the start of sequences from the target or host. This edge is used to provide a timing reference to the receiver.

Target transmissions are always referenced to a falling edge, host transmissions are referenced to a rising edge for the header, and a falling edge for the payload.

Extra bits added at the end of a sequence are used to confirm that data has been correctly decoded, and that the clock rate is accurate enough.

Synchronous encoding

Data is transmitted without any additional encoding, and with no oversampling. Since no oversampling is performed, filtering is not possible. A start bit is used to allow the wire to idle, and allow for synchronisation to be checked. The extra parity and stop bits are still added, to confirm that errors have not caused incorrect triggering or data corruption.

Baud Rate configuration

To allow flexibility in the baud rate used by a target, without requiring any host to be able to support the fastest possible target, a pre-scaler is used to generate the sampling clock. The prescaler should default to a value which ensures that the wire baud rate is between 50 kBaud and 8 MBaud.

The Prescaler allows DBGCLK to be divided by 1,2,3 or 4 before being used for the sampling clock. Assuming a minimum supported host baud rate of 8 MHz, this limits DBGCLK to 160 MHz, allowing a maximum baud rate of 32 MHz at 5× oversampling when the prescaler is set to 1.

Whenever a wire reset condition is detected, the TS should revert to a low baud rate. This provides safety against the baud rate being set to high, and debug connectivity being lost.

Table 4 summarises the range of baud rates with some associatedc time values.

filter may be implemented by passing the signal through a 3 stage delay line and using a majority vote to determine the output value.

Line turnaround

Figure 11:
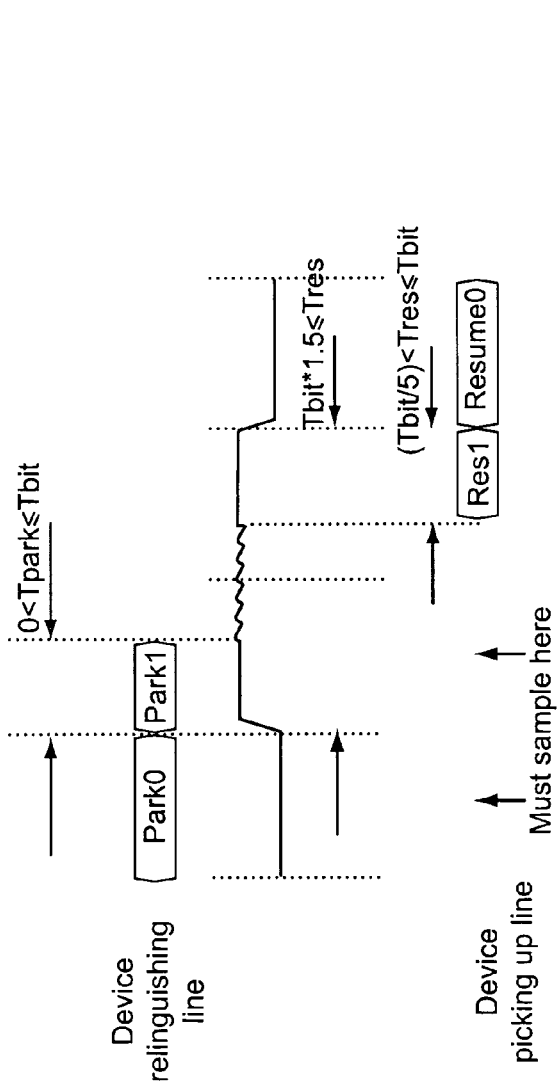
FIG. 11 illustrates asynchronous turn-around timing.

In order to avoid contention, a turn-round period is required when the device driving the wire changes. This period is specified by requiring the driving end to park the line HIGH, and then tristate by the end of the symbol period. The new driver must first verify that the line has been parked, then itself drive the line high, for no more than a symbol period. The new driver then typically drives the line LOW to indicate the start of it's transmission. This is demonstrated in FIG. 11.

When the line is parked, the driver is tri-stated by the end of the current bit period.

The resuming driver samples the 'Parked' state at the nominal bit centre point.

The resuming driver drives the line high for between ⅕ and 1 bit period.

The resuming driver does not drive the line low sooner than 1.5 bit periods after the start of the park period.

The maximum allowed delay before the line is driven low ($T_{res}$) depends on the location of the transition.

To allow for timing errors, After the PARK1 state, a one bit RESUME1 period is allowed where both drivers are driving high. This will be adequate for any oversampled mode, but for high speed synchronous operation, a longer turn-round period might be required due to tristate driver turn-off speeds. The RESUME1 period can be set to between 1 and 4 symbol periods by writing to the DP Wire control register to facilitate the use of high speed clocks.

The RESUME1 state could be replaced by an undriven (pull high) period, but the advantage of driving the line HIGH first is that it results in a timing reference transition which matches all subsequent data falling edges.

After the turn-round period, the device which resumes driving the wire must start by driving the wire LOW for a single bit period. This falling edge should be used by the receiving end as a symbol timing reference. The duration of the turnaround period cannot be predicted accurately, due to line delays and the two devices using asynchronous clock sources.

The Synchronous implementation of the protocol uses a simpler turn-round, only using PARK before the ACK response, and omitting the resume cycle in all cases.

TABLE 4

Baud rate and symbol timing

| Clock Frequency | Prescaler | Baud Rate | Bit period | Max slave drive phase duration (41 bits) | Max words/sec (write) |
|---|---|---|---|---|---|
| 1 MHz | 1 | 200 kBaud | 5 μs | 205 μs | 4k (128 kb/s) |
| 1 MHz | 4 | 50 kBaud | 20 μs | 820 μs | 1k (32 kb/s) |
| 160 MHz | 1 | 32 MBaud | 31.25 ns | 1.28 μs | 640k (20 Mb/s) |
| 160 MHz | 4 | 8 MBaud | 125 ns | 5.125 μs | 160k (5 Mb/s) |

Filtering and Sampling

There is some uncertainty as to the exact level of oversampling which will be required, and how this interacts with the filtering which is proposed. It might, for example, be possible to operate asynchronous non-encoded data at 3× oversampling, but it is more likely that a change to 6× oversampling could be beneficial.

Figure 12:
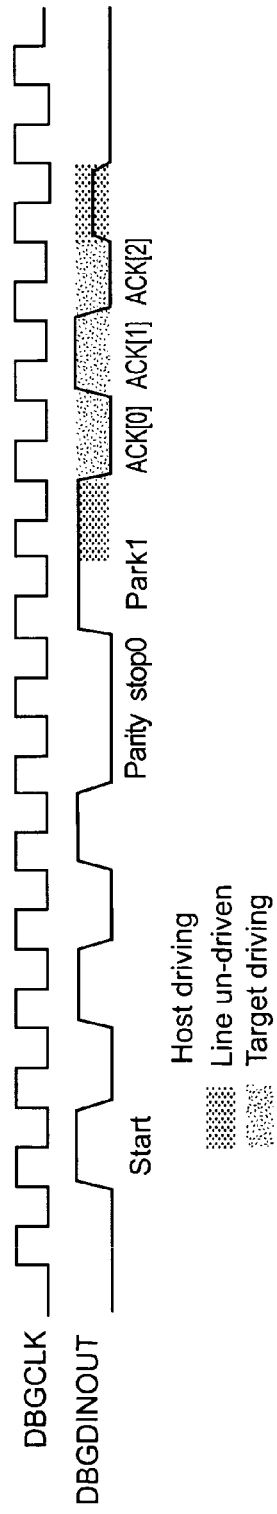
FIG. 12 illustrates a single wire debug port synchronous turn around timing (write)

To provide some accuracy in determining the centre of a bit from the start bit transition, 5× oversampling is proposed. A An example of synchronous turn-round is given in FIG. 12 below. See FIG. 15 for full details of the different turn-round sequences used in the different types of packet.

Idle and Reset

Between transfers, the host drives the line to the IDLE state, allowing the start of the next header to be detected. IDLE is specified as LOW for both synchronous and asynchronous operation to allow the target to recognise that a host device is connected. The length of any IDLE period between transfers is arbitrary.

The host is also free to leave the line high (driven or tri-stated) after a packet. This will reduce the static current drain, but will eventually be detected as a reset, and require retraining. To avoid generating a reset, the host must not leave the line HIGH for more than 165 µs unless it has knowledge of the target clock frequency.

It should be noted that the use of IDLE requires the start bit to be used to provide symbol timing for host header (as opposed to payload) transfers. The resume after turnaround will leave the line IDLE, but the delay before the falling edge of the start bit is not required to be precisely a symbol period. For the asynchronous protocol, a minimum of one symbol period of IDLE is required before each start bit.

In order that the host can detect the baud rate at which the target is operating, or to recover from loss of synchronisation, a reset can be signalled by not driving the wire. This is specified as HIGH for both synchronous and asynchronous operation, so that a reset is continuously seen if no host device is connected.

There is no explicit reset signal; rather reset will be detected by either host or target when the expected protocol is not observed. It is important to ensure that both ends of the link become reset before the protocol can be re-started with a training sequence. For the synchronous mode, reset should be signalled by providing 50 clock cycles with the wire high (or tri-state) followed by a read-ID request.

If the target detects that it has lost synchronisation (e.g. no resume seen when write data expected), it simply has to leave the line un-driven, and wait for the host to either retry with a new header, or signal a reset by leaving the line undriven. If the target sees repeated bad data sequences, it will lock-out until a reset sequence is seen.

If the host does not see an expected response from the target, it should first allow time for the target to return a data payload at the current baud rate. The host has the option to then re-try with a read to the target's ID register. If this does not succeed either, the host should attempt a reset. A 'short' reset period is valid at this point, provided some knowledge of the target's clock frequency is available, and if that fails, the full reset period should be used.

Timing for reset is determined as follows:

Reset should not be confused with a valid data period. Valid data can contain a sequence of Resume0, 32 data bits, and a parity bit. To ensure that the 'left high' state is invalid, parity is set to be even, and the longest run of '1's is 32.

At the minimum allowable baud rate of 50 k baud, data could generate a 640 µs HIGH period.

If the target switches from 1 MHz to 160 MHz clock (same prescale), it should not confuse data with RESET At 160 MHz, prescaled by 4, the target needs to count 32*160*5=25600 clock cycles of high to avoid detecting reset. The threshold is set at 28672 (0x7000) in this implementation.

At 1 MHz, prescaled by 4, the host needs to send a reset of more than 28672*4 µs.

The 'long' reset period is therefore defined as longer than 0.12 seconds.

The duration required for a short reset period can be calculated assuming knowledge of the current target clock rate and reset counter size.

Wire Protocol

Overview

The wire protocol is transmitted using the line interface specified above. Baud rate is determined by the target clock frequency, and the host is required to adapt itself to the target's clock speed. In order to accommodate a wide range of clock speeds, the wire manager includes a pre-scaler, which is used to generate the sampling clock.

The protocol is specified as a header (generated by the host), followed by an acknowledgement from the target, and an optional payload (from either host or target). Each transfer can result in a single data transfer of 32 bits, either a read or a write.

The different encoding schemes (synchronous or NRZ) do not change the protocol used over the wire, but they do change the turn-round which allows the two ends to drive the wire alternately without conflict.

Asynchronous mode specifies a nominal 3 bit period park, turn, resume sequence.

Synchronous mode uses a sequence consisting of just a single un-driven turn bit period.

Figure 13:
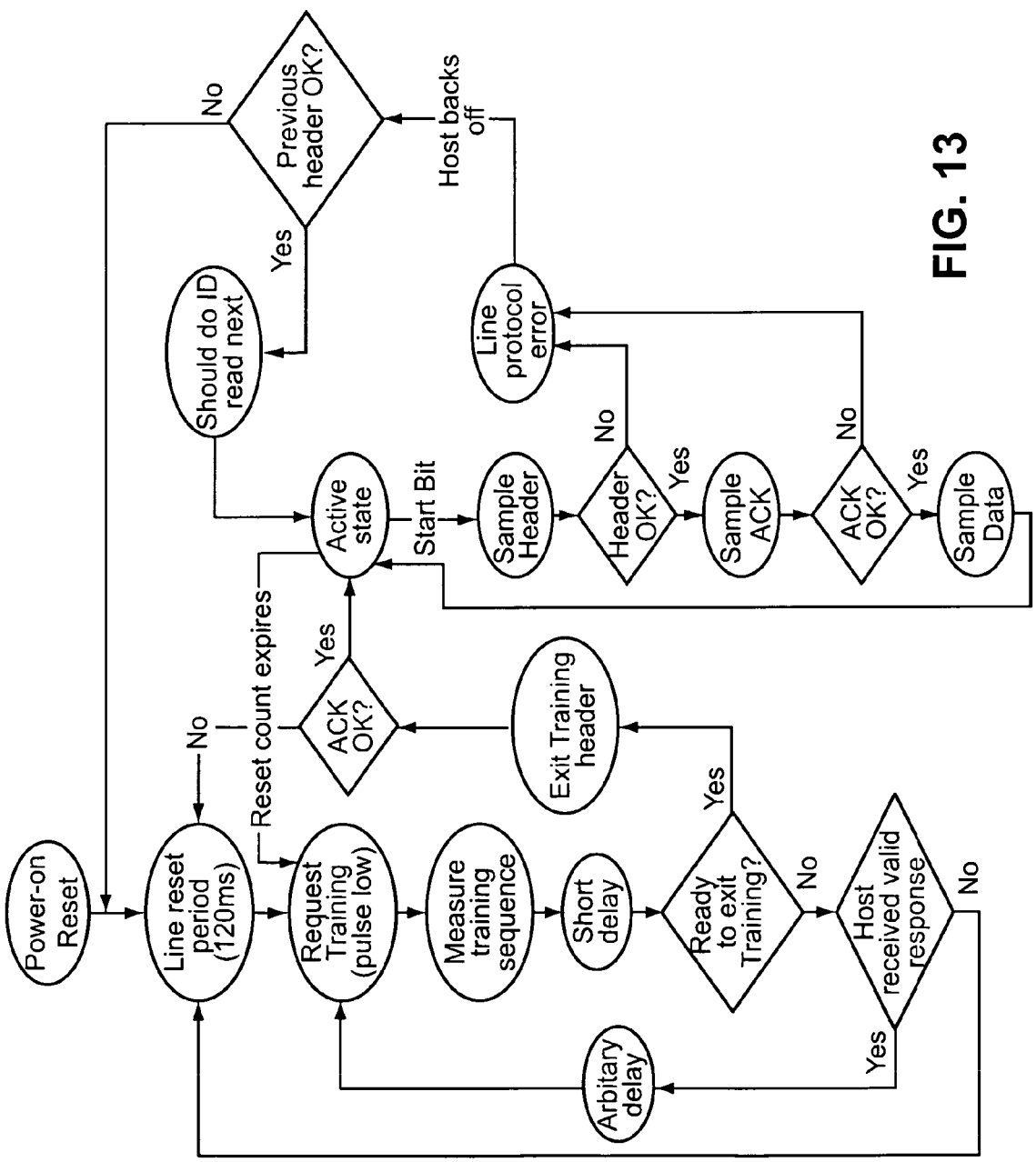
FIG. 13 illustrates wire protocol states.

Following a power-on-reset, the wire protocol will be in the 'Reset' state. In this state, the target will not respond until the host initiates a training sequence, and on successful completion of the training sequence, the protocol transitions to the 'Active' State. Loss of synchronisation or a line reset state will return the wire protocol to the 'Reset' state. This is shown in FIG. 13 below. Both target and host will have state machines which track the protocol and ensure that they remain in synchronization with each other. If either host or target transitions between 'Reset' and 'Active' then they must ensure that the other end of the link also reaches the same state.

If the interface is configured to start from power-on-reset in Synchronous mode then the first access must still be an ID register read. This provides some protection from spurious hot-connect transitions provoking unwanted transactions.

In order to verify that training has been successful, the training state is only exited by requesting an ID register read. If this is successful, both target and host will be in a known state.

Following any transfer, the host must always control the wire. For the asynchronous protocol only, after a read, the host can chose to avoid driving the line LOW (IDLE) without violating the line protocol. This can reduce target power consumption, but will signal a reset, to the target once the target's reset counter is triggered. After a write, the PARK1 to IDLE transition is used to confirm valid sampling.

Figure 14:
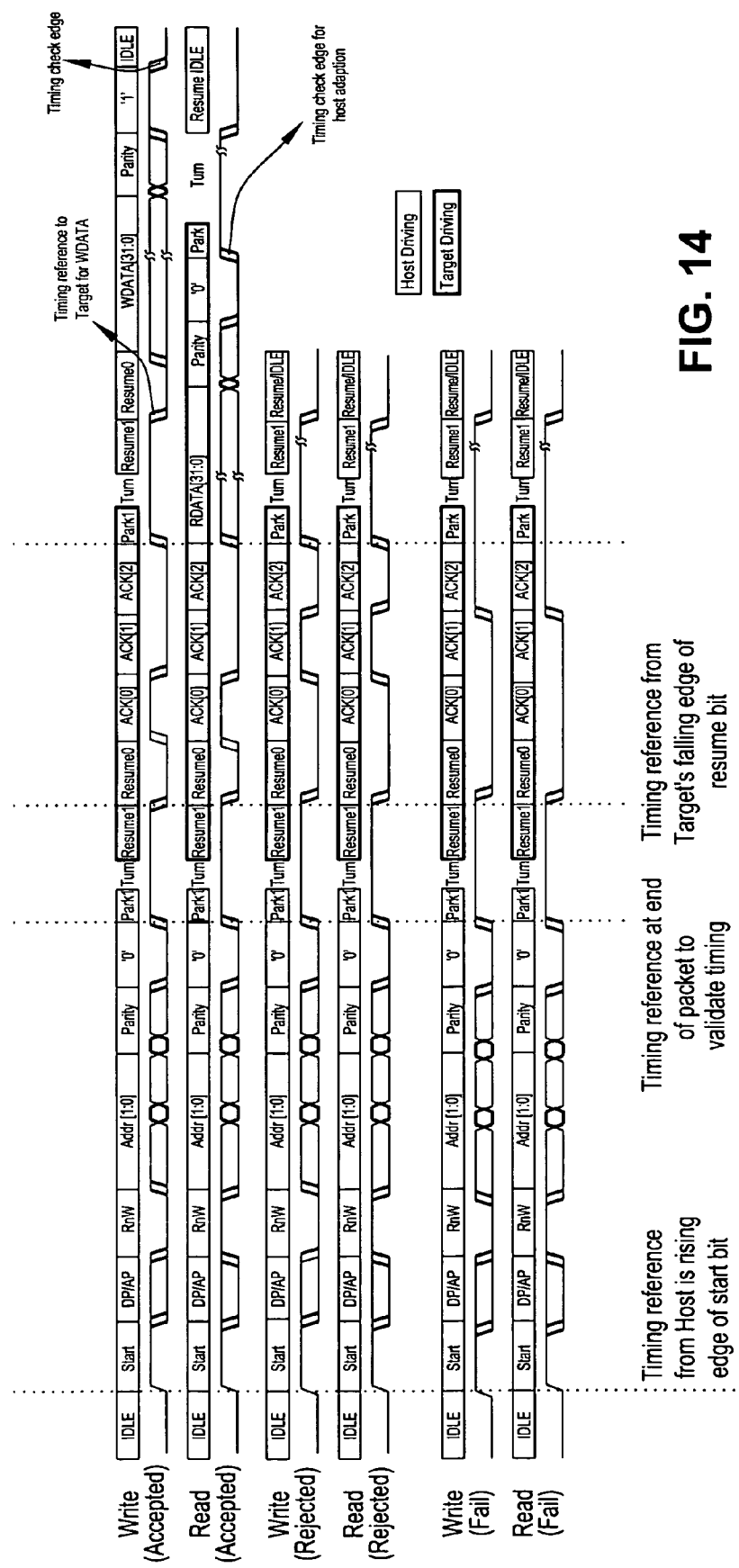
FIG. 14 illustrates a single wire debug port packet format (async)

FIG. 14 below shows the valid read and write packet formats, for read and write with 'OK' and 'Wait' and 'Fault' responses.

| | |
|---|---|
| #IDLE | Minimum of one symbol between asynchronous packets ('0') |
| Start | Start bit ('1'). |
| DP/AP | DPACC ('0') or APACC ('1') access (See Section Error! Reference source not found. for DPACC and APACC definitions) |
| RnW | Direction bit. Write = '0', Read = '1'. |
| ADDR[0:1] | DP Register Address or AP DAPADDR[3:2], LSB first. |
| Turn | Turnaround period. (The line is released at both ends and left to Tri-state) |
| ACK[0:2] | Acknowledge bits. (See section 0) For normal operation, a '10' means continue with next operation. |
| WDATA[0:31] | Data from Host to Target, LSB first. |
| RDATA[0:31] | Data from Target to Host, LSB first. |

Note that both address and data are sent LSB first.

In asynchronous mode, in order to provide known edge transitions at the start of each new transfer, the host must drive the line low for at least one bit period at the end of every packet, to reach the IDLE state. The start bit then provides a reference for the header timing. For the turn-round sequences mid-transfer, it is sufficient to drive a '0' Resume bit to provide the timing reference, since the acknowledgement bits always follow immediately.

The synchronous protocol does not require as many cycles dedicated to park and resume is omitted entirely, since it is assumed that timing is provided by the clock. Idle cycles between packets are optional, permitting back-to-back transfers (Start bit following parity for write, or turn-round for read), or transfers separated by IDLE periods (wire low). The host must drive the line IDLE if it does not immediately start a new transaction with a start bit.

The first transaction after a reset must be preceded by at least one cycle of IDLE, to signify the end of the reset sequence.

The synchronous protocol does park the line high at the end of a header to ensure that if the target does not respond then an acknowledge of 3b111 is seen, rather than the line slowly drifting high.

Figure 15:
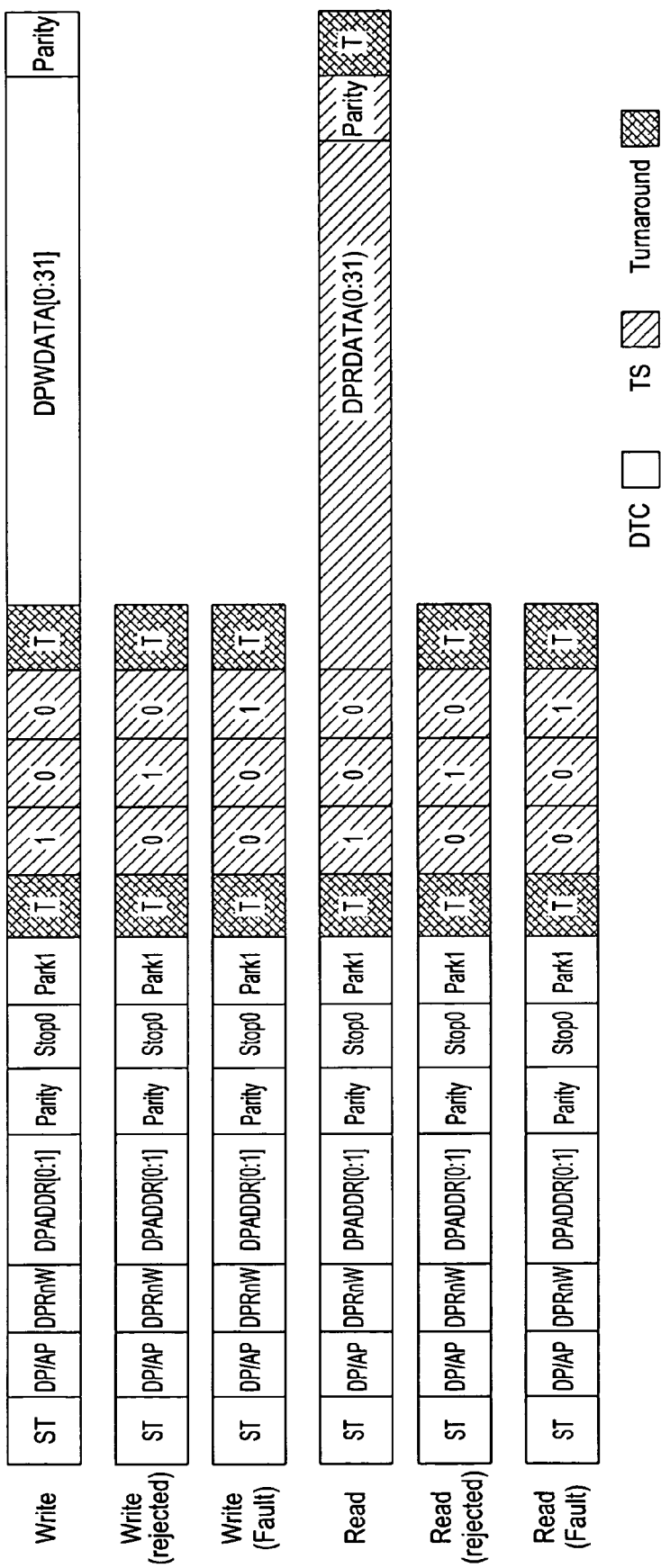
FIG. 15 illustrates synchronous protocol transfers.

Synchronous protocol transfers are shown in FIG. 15.

Parity Bits

Parity bits are used to protect the header part of the packet, and the data part separately. The ACK bits are redundantly encoded already, and do not use any additional protection.

To calculate the parity bit for the header, count the number of bits set out of DP/AP, RnW, ADDR[0:1]. If this is odd, (i.e. 1 or 3), then the parity bit should be set, to make the total number of 1s even.

To calculate the parity bit for a data field, count the number of bits set in just the 32 data bits. If this is odd, then the parity bit should be set, to make the total number of 1s even.

Error Handling

The responses to error conditions are as follows:

Target detects mismatch in header parity, stop0 or park1→no response (line un-driven Protocol Error), no action. The next transaction from the host must be a valid header, or the target will not respond until a line reset has been initiated.

Target detects error in WDATA resume (2 bit window), parity, Park1 or idle→Write is ignored. No action signalled to host until host initiates a new transfer. Target sets a write data error bit, and responds to every subsequent transaction with 'FAULT', except for a write to the abort register. If the following header from the host is not valid, the target will not respond until a line reset has been initiated.

Target detects 2 consecutive errored transmissions from host→Target waits for reset sequence.

Host detects missing resume (2 bit window), invalid ACK, or Park1 bits→Host must back-off (see below) to permit target time to send RDATA. Host must then request an ID register read.

Every header that is sent by the host is acknowledged by the target, allowing the target to cancel the payload phase of the transfer. The encodings for the acknowledgement bits are described in section 0.

The 'FAULT' response can also be caused by data transfers which have occurred within the target system, if the TS becomes unable to continue accepting a burst transfer. An example is a pushed verify, where data is written to the TS, and the TS is configured to compare the data written with a block of on-chip memory. The comparison will terminate at the first error, and the DTC must read the state of the debug port to determine where the mis-match occurred.

It is not necessary that the host reacts to the FAULT response, it is equally possible to complete a sequence of transactions and poll the status register to confirm correct operation.

Figure 16:
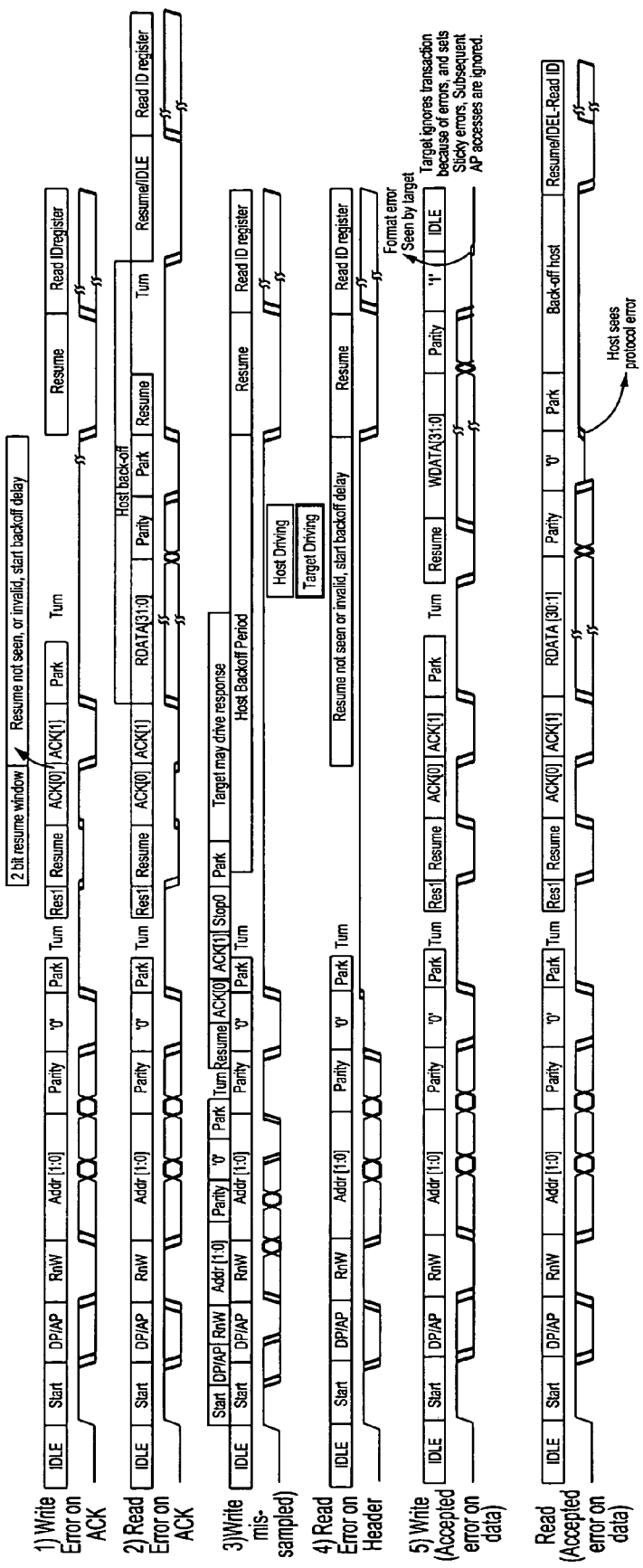
FIG. 16 illustrates a examples of asynchronous protocol errors.

Some examples of how the protocol deals with errors are shown in FIG. 16.

Example 1—One bit of the acknowledgement is corrupted after a write header. The host must back off, and then request an ID register read. The write will not have generated a transfer at the DAP side.

Example 2—One bit of the acknowledgement is corrupted after a read header, and the target continues sending read data. The host must back off and then request an ID register read. The read in this example will have generated a transfer at the DAP side. The DTC is able to determine the response which was sent to the original read by inspecting a DP register.

Example 3—The target has switched to a higher frequency, and a write header is sampled as a valid read. This is unlikely, but possible. The target responds, and there is also a small chance that the host samples a valid ACK. Line conflict is possible in this example.

Example 4—One bit of the read header is corrupted. The target does not respond. The host backs off, and requests an ID register read. The host is able to determine if the read generated a transfer at the DAP side by inspecting a DP register.

Example 5—A write header is accepted, but there is a corruption of the write data packet. A transaction is not generated at the DAP side, and an IGNORE response will be generated in response the next header, which will also not generate a transaction, unless it is an access to DP address 0x0.

Line Reset

The host is able to signal a reset to the target when it believes it has lost synchronisation with the target. This could be due to the protocol becoming mis-aligned, or a change in the clock frequency used for DBGCLK. The target will lock out and only respond to a reset following the reception of two consecutive headers containing errors.

In asynchronous mode, before sending a reset, the host should allow a 700 µs back-off period for the target to respond to any previous transaction. For asynchronous operation the interface will be reset at any time by releasing the wire to '1' for 28672 or more sample clocks.

The synchronous protocol signals a reset by driving the line HIGH and leaving it high for at least 50 sample clock periods. This will ensure that the interface is in a known state. Since the host provides the clock, the interface cannot time-out without some intervention from the host.

Once reset, SW-DP will no longer respond to the line until it has been driven to '0' and then high again to initiate a training sequence.

A line reset does not affect any pending DAP internal bus transaction. A line reset is used to recover from a loss of synchronisation, and if necessary, a write to the abort register can be used to trigger a DAP abort.

A line reset sets the prescaler to it's maximum value (as well as initialising the other bits in the wire control register). This leaves the line in asynchronous mode unless the interface is configured to operate in synchronous mode at all times.

Training

Training is performed in asynchronous mode only, and is managed by the Wire Manager. Training is required, as the host emulator does not generally know in advance the internal reference clock the SW-DP will use to communicate with the host.

In a configuration where the SW-DP is switched to synchronous mode from reset, no training sequence is required.

The exit training request is, however, still used to ensure that hot-plugging will not result in un-intentional transfers.

The target will only respond to a training request when the protocol is in the RESET state. The request for the training sequence cannot be anything more complex than a simple pulse, since the baud rate has not been agreed at this point.

The request for training should drive the line low for between 40 μs and 100 μs, then drive it high, and tri-state it within 125 ns.

Provided that the target samples 2 bit periods 'low', the target's response to a training request is to drive the line high then low, as for a normal turn-round sequence, hold it low for 4×32 bit periods, before driving high and tri-stating.

After the target has transmitted a training sequence to the host, a valid header request for 'Read ID' will be accepted, provided the resume is seen within 3 bit periods of the target parking for the end of the training sequence.

Provided that the host detects a training sequence response, it is free to make repeated requests for training before attempting to send an exit training sequence. The exit training sequence must be preceded by a successful request for training.

If the host does not detect a training pattern, it must leave the line HIGH for at least 120 ms and provoke another reset.

Figure 17:
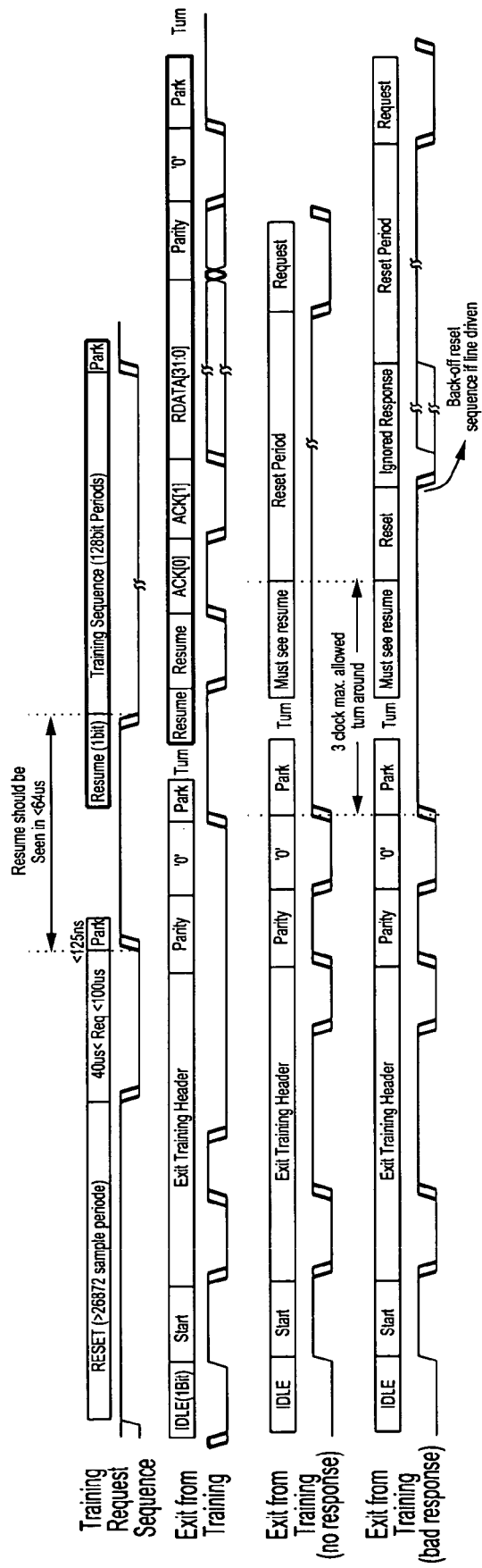
FIG. 17 illustrates training timing.

FIG. 17 shows the training request sequence and the possible host responses.

By having the host make an ID register read to exit the training state, there is a high level of confidence that the chosen frequency settings are useable. After transitioning into normal mode, the host can choose to update the reference divider for higher speed, and interrogate the registers to ensure a stable connection. Switching to synchronous mode is also possible if the system configuration permits it.

The target will always reset to its slowest baud rate after a power-on-reset.

Target acknowledgement

Following the transmission of a header from the host, a response from the target is required to indicate that the protocol is able to continue. The acknowledgement is used to 'pace' the host device, and to confirm that the link is stable.

The acknowledgement consists of three bits, preceded by a resume bit (asynchronous protocol only) which provides a timing reference. Three bits are used provide protection against single bit corruption whilst providing 4 possible valid responses. Since the OK and WAIT responses are most common, these are assigned to the two encodings which provide an additional 1→0 transition, making them less likely to be detected by miss-sampling when a baud rate change occurs. The possible values of the three ACK bits in the response sequence are shown in Table 5 below

TABLE 5

Acknowledgement bit encodings (asynchronous protocol)

| Resume1 | Resume0 | ACK[0] | ACK[1] | ACK[2] | Park1 | Purpose |
|---|---|---|---|---|---|---|
| 1 | 0 | 0 | 0 | 1 | 1 | Fault |
| 1 | 0 | 0 | 1 | 0 | 1 | Wait |
| 1 | 0 | 1 | 0 | 0 | 1 | OK |
| Z (high) | Z(high) | Z(high) | Z(high) | Z(high) | Z(High) | Protocol Error (not driven)[See Note] |

Note
The actual response for a protocol error is 'no response' (relying on the wire having been parked, and pulled-up). Since the target must assume that synchronization can be lost, no resume bits or ACK bits are driven to avoid conflict.

The same encoding is used in the synchronous version of the protocol.

TABLE 6

Acknowledgement bit encodings (synchronous protocol)

| ACK[0] | ACK[1] | ACK[2] | Purpose |
|---|---|---|---|
| 0 | 0 | 1 | Fault |
| 0 | 1 | 0 | Wait |
| 1 | 0 | 0 | OK |
| Z(high) | Z(high) | Z(high) | Protocol Error (not driven) |

The ACK bits are used to allow the target to signal the state of the wire interface, determining how the host should proceed.

OK response

If the target was in the initialization state, an OK response indicates that the target is synchronised to the host, and is about to send it's ID register.

If the host is in the normal operating mode, an OK response indicates that the host should proceed with the data phase of the transfer (read or write).

Protocol Error response

When the host receives no response, this is interpreted as the target signalling a protocol error. The host should back off in case the target is actually transmitting at a different baud rate, and then it can issue a new transfer. Requesting the ID register is mandated, since this provides confirmation that all is well with the SW-DP. If there is no response at the 2$^{nd}$ attempt, the only recourse is a line reset and re-training, since the target should have now decided only to respond to a reset request. If the transfer which resulted in the protocol error response was a write, it can be safely assumed that no write occurred. It is possible that a read could be performed by on the DAP bus and a protocol error response still detected by the host (although unlikely).

Wait response

The 'Wait' response is used to indicate to the host that the DAP is processing the previous AP transfer. A wait response will not be generated in response to an ID register read or a write to the abort register. Other accesses must be prevented if an AP access is in progress.

When a WAIT response is detected, this should normally result in a retry of the same transfer, allowing the protocol to process data as quickly as possible. Once several retries have been attempted, and time allowed for a slow interconnect and memory system to respond, the host can write to the abort register and generate a DAPABORT. This would signal to the active AP that it should terminate the transfer it is currently attempting, permitting access to other parts of the debug system. Some APs are unable to terminate a transfer on their ASIC interface, but they must allow the Single Wire interface to be freed up.

It is up to the host to decide how to manage the waiting forever/abort sequence.

Fault response

If the DP detects an error in the data packet for a write transaction, it must signal to the host that the write has not been performed. This is achieved by setting a sticky protocol error bit when the error is detected. Whilst this bit is set, the DP will only respond normally to ID/abort register accesses. Any other access will result in a FAULT response being returned, with no data phase. The FAULT response permits the protocol to remain synchronised, and provides the host with the option of streaming a block of data then checking the status register at the end of a block. Fault is also sent as a response when either StickyError or StickyCompare have been set, providing quick notification to the host of these conditions.

Once any of the the sticky bits have been set, the only accesses which the DP will respond normally to are ID register reads, status register reads and abort register writes. The sticky protocol error bit is cleared by writing a bit in the abort register. StickyCompare and StickyError are also cleared by writing to bits in the abort register.

After a fault response is received by the host, the host should allow time for the DP to tri-state the wire, then drive the wire LOW to indicate the IDLE state for one bit period before attempting a new transfer.

Other responses

Any other response combination will indicate that corruption of the response sent by the target has occurred. Although the host will know that corruption has occurred, it is unable to determine the difference between an OK response (which could have resulted in modification of the DAP), and a FAULT or WAIT response. Significantly, the target could also be expecting WDATA, or sending RDATA. The host must therefore back-off as it would for a protocol error response. When the original transfer was a read, it is then necessary to determine what the response was. This is made possible by recording the response to the last valid read to AP or DP READBUF. Then an invalid response is received in response to a read, the host should check the status register to determine if the read request had any side-effect.

Slave response sequences

In all cases, a header will result in one acknowledge and a single optional 32 bit data transfer. The direction of the data transfer is determined by the direction field in the header.

Table 7 below demonstrates all possible transfer sequences based on the state of the DP and the interface to the AP:

TABLE 7

Slave response sequences

| Read/Write | AP/DP | Address | Valid protocol | Any Sticky bit set | DAP Interface | Response | Action |
|---|---|---|---|---|---|---|---|
| R | DP | Any | Yes | No | READY | OK | Respond with register value from DP (no delay). |
| W | DP | Any | Yes | No | READY | OK | Write WDATA value to DP register if parity is good, else set WDATAERR. |
| R | AP | Any | Yes | No | READY | OK | Respond with value from previous AP read. |
| W | AP | Any | Yes | No | READY | OK | Write WDATA value to AP register if parity is good, else set WDATAERR. |
| R | DP | 0x0 or 0x1 | Yes | Any | STALLED | OK | Respond with DP ID or status register value. |
| R | DP | 0x2 or 0x3 | Yes | No | STALLED | WAIT | No data phase |
| R | DP | 0x2 or 0x3 | Yes | Yes | Any | FAULT | No data phase |
| W | DP | 0 | Yes | Any | Any | OK | Write WDATA value to DP abort register if parity is good. else set StkProtocolErr. |
| W | DP | ≠0 | Yes | No | STALLED | WAIT | No Data Phase |
| W | DP | ≠0 | Yes | Yes | Any | FAULT | No Data Phase |
| R | AP | Any | Yes | No | Stalled | WAIT | No Data Phase |
| W | AP | Any | Yes | No | Stalled on READ | WAIT | No Data Phase |
| W | AP | Any | Yes | No | Stalled on Write | OK | Write WDATA value to AP register if parity is good, else set StkProtocolErr. |
| W | AP | Any | Yes | No | Stalled with pending Write | WAIT | No Data Phase |
| R | AP | Any | Yes | Yes | Any | FAULT | No Data Phase |
| W | AP | Any | Yes | Yes | Any | FAULT | No Data Phase |
| Any | Any | Any | No | Any | Any | None (tristate) | No data phase |

Host response to acknowledge

The behaviour of the host in response to each possible slave response is defined in Table 8 below

TABLE 8

Host response to acknowledgements

| Read/Write | Slave ACK | Host response (data phase) | Host action |
| --- | --- | --- | --- |
| Read | OK | Capture read data and check for valid protocol[1] | May need to re-issue previous read if unable to flag data as invalid. |
| Write | OK | Send write data. | Next access will confirm validity of this transfer. |
| Any | WAIT | No data phase | Repeat the same header unless wait timeout has been reached. Use DAP abort if necessary to allow access to AP. |
| Any | IGNORE | No data phase | Can send new headers, but only an access to DP address 0x0 will provide a valid response. |
| Any | No ACK (Protocol Error) | Back off to allow for possible data phase. | Can make a successful ID register read next to confirm baud rate is good, otherwise must re-train. |
| Read | Invalid ACK | Back off to allow for possible data phase. | Should check status register to determine if the response sent was 'OK'. |
| Write | Invalid ACK | Back off to ensure target does not capture next header as WDATA. | Repeat write. A FAULT response is possible if the first response was OK, but the subsequent is unaffected by the first (mis-read) response. |

[1]The emulator-host interface might be able to support corrupted reads, or the emulator might have to re-try the transfer.

Host Backoff

When the host detects any response from the slave other than a correct, driven response, the host must assume that a change in slave clock rate has occurred. Rather than re-training immediately, it is desirable to re-try with another access to reduce the impact caused by a single bit-error on the wire. It is also desirable to avoid conflict caused by both host and target driving the line to different values simultaneously. Note that with the limited amount of redundancy in the protocol, some scenarios can be constructed where conflict does occur for a brief period.

The host cannot leave the line high for longer than 0×7000 pre-scaled target clock sample ticks if it is to avoid the target detecting a reset sequence. The host should know that the ratio of target clock frequency cannot change by a factor of more than 160. If the target frequency were to change from 1 MHz to 160 MHz, the critical line high period becomes 35.8 bit periods.

If the target has actually changed to a lower clock frequency, it is valid for the host to back off for a longer period, and this is also necessary if conflict is to be avoided. The benefit of this is, however, dubious. As the backoff period approaches the duration of a retraining sequence, the bandwidth benefit of a method to recover from a bit error is lost. Since it is impractical to guarantee there will never be conflict the backoff period is specified to reduce conflict, and give a simple implementation.

Figure 18:
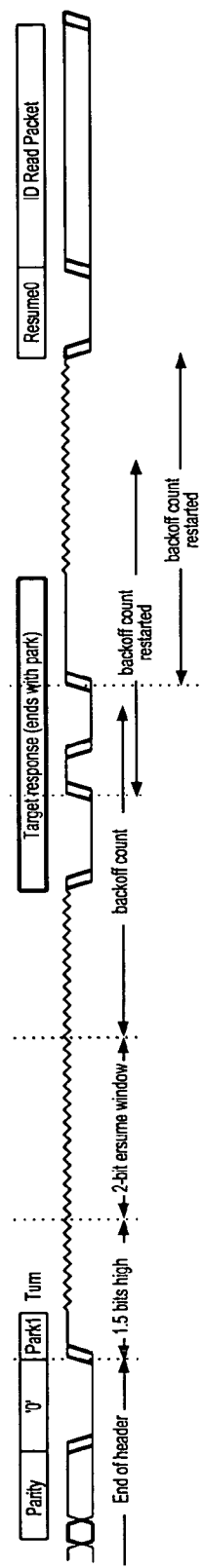
FIG. 18 illustrates resume and backoff timings.

The target is able to drive the line up to the $40^{th}$ bit after the host drives it's final 0→1 transition for park, when the target believes it is responding to a read request. The target will, however drive '0' at bits 3, 5 and 39—irrespective of the data value. In order to minimise the chance of conflict, the host should wait for the equivalent of 35 of the current bit periods consecutive with the line high before driving the line to IDLE as a back off. This is shown in FIG. 18.

Abort Register

The abort register is a write only register at the same address as the ID register. This is the only address which is writable when the DAP internal bus is stalled, a sticky bit is set or the AP has detected an error in a write data packet.

Writing a 1 to bit[0] of the abort register is used to cancel any outstanding transfer on the DAP internal bus. The AP which is being accessed will be requested to terminate the transfer it is performing, even if this will result in unpredictable behaviour. While a DAP transfer is pending, or the repeat counter is running, any access other than a write to the abort register will return a WAIT response.

Writing a 1 to bit[1] of the abort register is used to clear the StickyCompare bit. While the sticky compare bit is set, only writes to the abort register, or reads from the ID and status registers can return an OK response. Any other accesses will return a FAULT response.

Writing a 1 to bit[2] of the abort register is used to clear the StickyError bit. While the sticky error bit is set, only writes to the abort register, or reads from the ID and status registers can return an OK response. Any other accesses will return, a FAULT response.

It should be noted that terminating a transfer on the DAP internal bus will not terminate a transfer which has been initiated by the AP, so although it becomes possible to access DP and AP registers, and identify the state of the DAP, it is sometimes not possible to continue debugging without generating a reset. If there are multiple APs on the DAP, it is possible to extract some status information before having to reset. If the interface which the AP provides is able to terminate an in-progress transaction, that will be controlled by making an access to a control register in the AP.

Following an abort, the host should always read the DP status register to confirm that the target is still responding to the wire.

The SW-DP must respond OK to a write to the abort register.

Bit Encodings

The un-driven state of the line must be HIGH to allow sharing the SWDIO pad with a JTAG interface. The line is driven LOW for the idle state, allowing the un-driven or HIGH state to correspond to a RESET.

All header packets, in both synchronous and asynchronous mode, are required to end by parking the line HIGH. This reduces the chance of confusion arising if the line were left LOW, and slowly drifted HIGH due to the pull-up.

Transfer Timings

This section describes the interaction between the timing of transactions on the single wire interface, and the DAP internal bus transfers, showing when the target will respond with a 'WAIT' acknowledgement.

Figure 19:
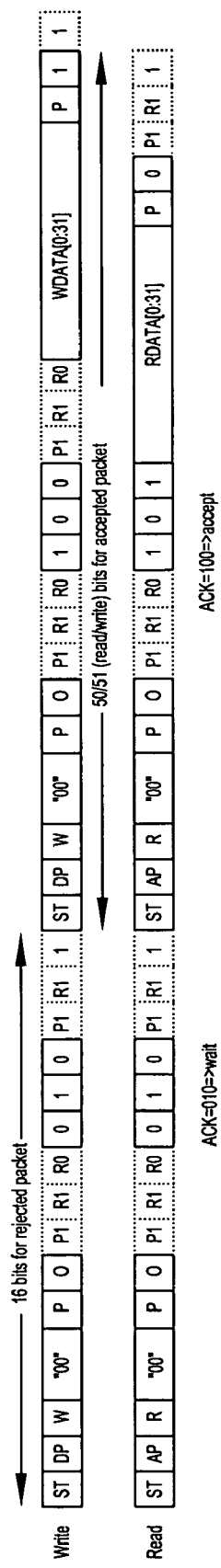
FIG. 19 illustrates acknowledgement timing (asynchronous)
Figure 20:
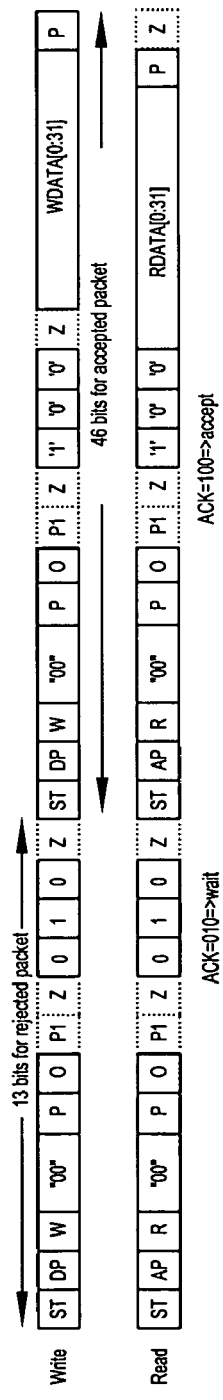
FIG. 20 illustrates acknowledgement timing (synchronous)

The effect of signalling ACK=WAIT on the length of the packet is demonstrated in FIG. 19 and 20.

When ACK=WAIT, the 32-bit data part of the packet is cancelled, and only the 16 bits of header and turnaround are sent. See. The synchronous version is shorter, since it does not use the Resume1/Resume0 sequence.

An AP access will result in the generation of a transfer on the DAP internal bus. These transfers have an address phase, and a data phase. The data phase is extended by the AP if it requires extra time to process the transaction (for example if it needs to perform an AHB access to the system bus to read data).

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit for processing data, said integrated circuit comprising:
   a functional circuit configured to perform data processing operations:
   a diagnostic circuit configured to perform diagnostic operations upon said functional circuit, and
   an interface circuit configured to use a bi-directional serial link to provide communications between said diagnostic circuit and an external diagnostic device,
   wherein said interface circuit and said external diagnostic device are configured when changing communication direction such that a sequence is followed comprising:
   (i) driving a signal carried on said bi-directional serial link to a park state having a predetermined signal value for a park state period with whichever one of said interface circuit and said external diagnostic device was serving as a data sender;
   (ii) providing for said signal carried on said bi-directional serial link to be substantially undriven and float at substantially said predetermined signal value for an undriven state period;
   (iii) driving said signal carried on said bi-directional serial link to a resume state having signal value opposite to said predetermined signal value for a resume state period with whichever one of said interface circuit and said external diagnostic device is to now serve as said data sender.

2. An integrated circuit as claimed in claim 1, wherein transition of said signal carried on said bi-directional serial link from substantially said predetermined signal value during said undriven state period to said signal value opposite to said predetermined signal value during said resume state period is used as a timing reference for subsequent sampling of said signal carried on said bi-directional serial link by whichever one of said interface circuit and said external diagnostic device is to now serve as a data receiver.

3. An integrated circuit as claimed in claim 1 wherein, if said signal carried on said hi-directional serial link is not driven to said resume state by whichever one of said interface circuit and said external diagnostic device is to now serve as said data sender, then this is detectable as a communication error by whichever one of said interface circuit and said external diagnostic device was serving as said data sender.

4. An integrated circuit as claimed in claim 3, wherein following said communication error, changing communication direction is retried for a predetermined number times and, if said communication error remains, then communication between said interface circuit and said external diagnostic device is reset.

5. An integrated circuit as claimed in claim 1, wherein, if said interface circuit has partly received a current frame of data and cannot continue to correctly receive data being sent via said signal carried on said bi-directional serial link, then said interface circuit is configured to assert a wait signal and ignore subsequently received bi-directional serial signals in said current frame of data.

6. An integrated circuit as claimed in claim 5, wherein said interface circuit is configured to ignore subsequently received bi-directional serial signals until said wait signal is cleared by said external diagnostic device.

7. An integrated circuit as claimed in claim 1, wherein, if said interface circuit has partly received a current frame of data and detects a fault, then said interface circuit is configured to assert a fault signal and ignore subsequently received bi-directional serial signals in said current frame of data.

8. An integrated circuit as claimed in claim 7, wherein said interface circuit is configured to ignore subsequently received signals on said bi-directional serial link until said fault signal is cleared by said external diagnostic device.

9. An integrated circuit as claimed in claim 1, wherein, if said interface circuit does not detect a valid message when receiving said signals carried on said bi-directional serial link, then said interface circuit is configured to ignore said signals carried on said bi-directional serial link until a valid message is received.

10. An integrated circuit for processing data, said integrated circuit comprising:
    a functional circuit configured to perform data processing operations:
    a diagnostic circuit configured to perform diagnostic operations upon said functional circuit, and
    an interface circuit configured to use a bi-directional serial link to provide communications between said diagnostic circuit and an external diagnostic device,
    wherein, a signal carried on said bi-directional serial link has a default signal value when not being driven by either said interface circuit or said external diagnostic device and, during initialization of communication via said signal carried on said bi-directional serial link, said interface circuit is configured to drive said signal carried on said bi-directional serial link to a signal value opposite to said default signal value for a training period corresponding to a predetermined number of clock periods of an interface circuit clock signal initially to be used by said interface circuit, said external diagnostic device being configured to detect said training period and to adjust to use an external diagnostic device clock signal compatible with said interface signal clock.

11. An integrated circuit as claimed in claim 10, wherein following initialization of communication via said signal carried on said bi-directional serial link, said interface circuit and said external diagnostic device are configured to communicate to establish if a higher signal clock speed is mutually supported to allow faster communication.

12. An integrated circuit as claimed in claim 10, wherein said interface circuit is configured to be triggered to commence initialization of communication by said external diagnostic device driving said signal carried on said bi-directional serial link to said signal value opposite to said default signal value for a reset period corresponding to greater than a predetermined number of clock periods as measured by said interface circuit.

13. An integrated circuit as claimed in claim 10, wherein, if said interface circuit has partly received a current frame of data and cannot continue to correctly receive data being sent via said signal carried on said bi-directional serial link, then said interface circuit is configured to assert a wait signal and ignore subsequently received bi-directional serial signals in said current frame of data.

14. An integrated circuit as claimed in claim 13, wherein said interface circuit continues to ignore subsequently received bi-directional serial signals until said wait signal is cleared by said external diagnostic device.

15. A method of communicating with a diagnostic circuit configured to perform diagnostic operations upon a functional circuit within an integrated circuit, said method comprising the steps of:
communicating with a bi-directional serial link via an interface circuit,
wherein said interface circuit and said external diagnostic device are configured, when changing communication direction, such that a sequence is followed comprising:
(i) driving a signal carried on said bi-directional serial link to a park state having a predetermined signal value for a park state period with whichever one of said interface circuit and said external diagnostic device was serving as a data sender;
(ii) providing for said signal carried on said bi-directional serial link to be substantially undriven and float at substantially said predetermined signal value for an undriven state period;
(iii) driving said signal carried on said bi-directional serial link to a resume state having signal value opposite to said predetermined signal value for a resume state period with whichever one of said interface circuit and said external diagnostic device is to now serve as said data sender.

16. A method as claimed in claim 15, wherein transition of said signal carried on said bi-directional serial link from substantially said predetermined signal value during said undriven state period to said signal value opposite to said predetermined signal value during said resume state period is used as a timing reference for subsequent sampling of said signal carried on said bi-directional serial link by whichever one of said interface circuit and said external diagnostic device is to now serve as a data receiver.

17. A method as claimed in claim 15, wherein, if said signal carried on said bi-directional serial link is not driven to said resume state by whichever one of said interface circuit and said external diagnostic device is to now serve as said data sender, then this is detected as a communication error by whichever one of said interface circuit and said external diagnostic device was serving as said data sender.

18. A method as claimed in claim 17, wherein following said communication error, changing communication direction is retried for a predetermined number times and, if said communication error remains, then communication between said interface circuit and said external diagnostic device is reset.

19. A method as claimed in claim 15, wherein, if said interface circuit has partly received a current frame of data and cannot continue to correctly receive data being sent via said signal carried on said bi-directional serial link, then said interface circuit asserts a wait signal and ignores subsequently received bi-directional serial signals in said current frame of data.

20. A method as claimed in claim 19, wherein said interface circuit continues to ignore subsequently received signals on said bi-directional serial link until said wait signal is cleared by said external diagnostic device.

21. A method as claimed in claim 15, wherein, if said interface circuit has partly received a current frame of data and detects a fault, then said interface circuit asserts a fault signal and ignores subsequently received signals on said bi-directional serial link in said current frame of data.

22. A method as claimed in claim 21, wherein said interface circuit continues to ignore subsequently received signals on said bi-directional serial link until said fault signal is cleared by said external diagnostic device.

23. A method as claimed in claim 15, wherein, if said interface circuit does not detect a valid message when receiving said signal carried on said bi-directional serial link, then said interface circuit ignores signals carried on said bi-directional serial link until a valid message is received.

24. A method of communicating with a diagnostic circuit configured to perform diagnostic operations upon a functional circuit within an integrated circuit, said method comprising the steps of:
communicating with a bi-directional serial link via an interface circuit,
wherein, a signal carried on said bi-directional serial link has a default signal value when not being driven by either said interface circuit or said external diagnostic device and, during initialization of communication via said signal carried on said bi-directional serial link, said interface circuit drives said signal carried on said bi-directional serial link to a signal value opposite to said default signal value for a training period corresponding to a predetermined number of clock periods of an interface circuit clock signal initially to be used by said interface circuit, said external diagnostic device being configured to detect said training period and to adjust to use an external diagnostic device clock signal compatible with said interface signal clock.

25. A method as claimed in claim 24, wherein following initialization of communication via said signal carried on said bi-directional serial link, said interface circuit and said external diagnostic device communicate to establish if a higher signal clock speed is mutually supported to allow faster communication.

26. A method as claimed in claim 24, wherein said interface circuit is triggered to commence initialization of communication by said external diagnostic device driving said signal carried on said bi-directional serial link to said signal value opposite to said default signal value for a reset period corresponding to greater than a predetermined number of clock periods as measured by said interface circuit.

27. A method as claimed in claim 24, wherein, if said interface circuit has partly received a current frame of data and cannot continue to correctly receive data being sent via said signal carried on said bi-directional serial link, then said interface circuit asserts a wait signal and ignores subsequently received bi-directional serial signals in said current frame of data.

28. A method as claimed in claim 27, wherein said interface circuit continues to ignore subsequently received bi-directional serial signals until said wait signal is cleared by said external diagnostic device.

29. A diagnostic device for performing diagnostic operations upon an integrated circuit, said diagnostic device comprising:

an interface circuit configured to provide communication between said diagnostic device and a diagnostic circuit within said integrated circuit; wherein said interface circuit configured to use a bi-directional serial link to provide communications between said diagnostic circuit and said diagnostic device, wherein said interface circuit and said diagnostic device are configured when changing communication direction such that a sequence is followed comprising:

(i) driving a signal carried on said bi-directional serial link to a park state having a predetermined signal value for a park state period with whichever one of said interface circuit and said diagnostic device was serving as a data sender;

(ii) providing for said signal carried on said bi-directional serial link to be substantially undriven and float at substantially said predetermined signal value for an undriven state period;

(iii) driving said signal carried on said bi-directional serial link to a resume state having signal value opposite to said predetermined signal value for a resume state period with whichever one of said interface circuit and said diagnostic device is to now serve as said data sender.

30. A diagnostic device as claimed in claim 29, wherein transition of said signal carried on said bi-directional serial link from substantially said predetermined signal value during said undriven state period to said signal value opposite to said predetermined signal value during said resume state period is used as a timing reference for subsequent sampling of said signal carried on said bi-directional serial link by whichever one of said interface circuit and said diagnostic device is to now serve as a data receiver.

31. A diagnostic device as claimed in claim 29, wherein, if said bi-directional signal is not driven to said resume state by whichever one of said interface circuit and said diagnostic device is to now serve as said data sender, then this is detectable as a communication error by whichever one of said interface circuit and said diagnostic device was serving as said data sender.

32. A diagnostic device as claimed in claim 31, wherein following said communication error, changing communication direction is retried for a predetermined number times and, if said communication error remains, then communication between said interface circuit and said diagnostic device is reset.

33. A diagnostic device as claimed in claim 29, wherein, if said interface circuit has partly received a current frame of data and cannot continue to correctly receive data being sent via said signal carried on said bi-directional serial link, then said interface circuit asserts a wait signal and ignores subsequently received bi-directional serial signals in said current frame of data.

34. A diagnostic device as claimed in claim 33, wherein said interface circuit is configured to ignore subsequently received signals carried over said bi-directional serial link until said wait signal is cleared by said external diagnostic device.

35. A diagnostic device as claimed in claim 29, wherein, if said interface circuit has partly received a current frame of data and detects a fault, then said interface circuit is configured to assert a fault signal and ignore subsequently received signals carried over said bi-directional serial link in said current frame of data.

36. A diagnostic device as claimed in claim 35, wherein said interface circuit is configured to ignore subsequently received bi-directional serial signals until said fault signal is cleared by said external diagnostic device.

37. A diagnostic device as claimed in claim 29, wherein, if said interface circuit does not detect a valid message when receiving said signal carried on said bi-directional serial link, then said interface circuit configured to ignore said signal carried on said bi-directional serial links until a valid message is received.

38. A diagnostic device for performing diagnostic operations upon an integrated circuit, said diagnostic device comprising:

an interface circuit configured to provide communication between said diagnostic device and a diagnostic circuit within said integrated circuit; wherein said interface circuit is configured to use a bi-directional serial link to provide communications between said diagnostic circuit and said diagnostic device, wherein, a signal carried on said bi-directional serial link has a default signal value when not being driven by either said interface circuit or said diagnostic device and, during initialization of communication via said signal carried on said bi-directional serial link, said interface circuit is configured to drive said signal carried on said bi-directional serial link to a signal value opposite to said default signal value for a training period corresponding to a predetermined number of clock periods of an interface circuit clock signal initially to be used by said interface circuit, said diagnostic device being configured to detect said training period and to adjust to use an diagnostic device clock signal compatible with said interface signal clock.

39. A diagnostic device as claimed in claim 38, wherein following initialization of communication via said signal carried on said bi-directional serial link, said interface circuit and said external diagnostic device communicate to establish if a higher signal clock speed is mutually supported to allow faster communication.

40. A diagnostic device as claimed in claim 39, wherein said interface circuit is configured to be triggered to commence initialization of communication by said diagnostic device driving said signal carried on said bi-directional serial link to said signal value opposite to said default signal value for a reset period corresponding to greater than a predetermined number of clock periods as measured by said interface circuit.

41. A diagnostic device as claimed in claim 38, wherein, if said interface circuit has partly received a current frame of data and cannot continue to correctly receive data being sent via said signal carried on said bi-directional serial link, then said interface circuit is configured to assert a wait signal and ignore subsequently received bi-directional serial signals in said current frame of data.

42. A diagnostic device as claimed in claim 41, wherein said interface circuit is configured to ignore subsequently received bi-directional serial signals until said wait signal is cleared by said external diagnostic device.

* * * * *